United States Patent
Teranishi et al.

(10) Patent No.: US 10,437,364 B2
(45) Date of Patent: Oct. 8, 2019

(54) SENSOR AND SENSOR-EQUIPPED DISPLAY DEVICE

(71) Applicant: Japan Display Inc., Tokyo (JP)

(72) Inventors: Yasuyuki Teranishi, Tokyo (JP); Hayato Kurasawa, Tokyo (JP); Koji Noguchi, Tokyo (JP)

(73) Assignee: Japan Display Inc., Tokyo (JP)

( * ) Notice: Subject to any disclaimer, the term of this patent is extended or adjusted under 35 U.S.C. 154(b) by 241 days.

(21) Appl. No.: 15/465,837

(22) Filed: Mar. 22, 2017

(65) Prior Publication Data

US 2017/0277316 A1 Sep. 28, 2017

(30) Foreign Application Priority Data

Mar. 28, 2016 (JP) ................................ 2016-063607

(51) Int. Cl.
  *G06F 3/041* (2006.01)
  *G02F 1/1343* (2006.01)
  (Continued)

(52) U.S. Cl.
  CPC ........ *G06F 3/0412* (2013.01); *G02F 1/13338* (2013.01); *G02F 1/134309* (2013.01); *G02F 1/136286* (2013.01); *G06F 3/044* (2013.01); *G06F 3/0416* (2013.01); *H01L 27/323* (2013.01); *H01L 27/3211* (2013.01); *H01L 27/3223* (2013.01); *H01L 27/3276* (2013.01); *G02F 2201/123* (2013.01); *G06F 2203/04108* (2013.01)

(58) Field of Classification Search
  CPC .................. G06F 3/0412; G06F 3/044; G06F 2203/04108; G06F 3/0416; G02F 1/136286; G02F 2201/123; G02F 1/134309; G02F 1/13338; H01L 27/3211; H01L 27/3223; H01L 27/323; H01L 27/3276

See application file for complete search history.

(56) References Cited

U.S. PATENT DOCUMENTS

| 2011/0102359 A1* | 5/2011 | Chiba | G02F 1/13338 345/173 |
| 2015/0242019 A1* | 8/2015 | Dunphy | G06F 3/0412 345/174 |
| 2016/0274727 A1 | 9/2016 | Nakamura | |

FOREIGN PATENT DOCUMENTS

| JP | 2009-4348 A | 1/2009 |
| JP | 2014-238816 A | 12/2014 |

(Continued)

OTHER PUBLICATIONS

Japanese Office Action dated Jun. 25, 2019, corresponding to Japanese Application No. 2016-063607.

*Primary Examiner* — Andrew Sasinowski
(74) *Attorney, Agent, or Firm* — Michael Best & Friedrich LLP

(57) ABSTRACT

According to one embodiment, a sensor-equipped display device, includes pixel electrodes above an insulating substrate, a first sensor electrode includes a first electrode portion and a first line portion connected to the first electrode portion, and a second sensor electrode includes a second electrode portion and a second line portion connected to the second electrode portion, each of the first sensor electrode and the second sensor electrode being opposed to the pixel electrodes, and includes a first conductive layer and a second conductive layer which is disposed on the first conductive layer.

17 Claims, 21 Drawing Sheets

(51) Int. Cl.
*G02F 1/1333* (2006.01)
*G02F 1/1362* (2006.01)
*H01L 27/32* (2006.01)
*G06F 3/044* (2006.01)

(56) References Cited

FOREIGN PATENT DOCUMENTS

| | | |
|---|---|---|
| JP | 2015-106240 A | 6/2015 |
| JP | 2015-209556 A | 11/2015 |
| JP | 2015-228210 A | 12/2015 |
| JP | 2016-31551 A | 3/2016 |
| WO | 2010/029662 A1 | 3/2010 |

* cited by examiner

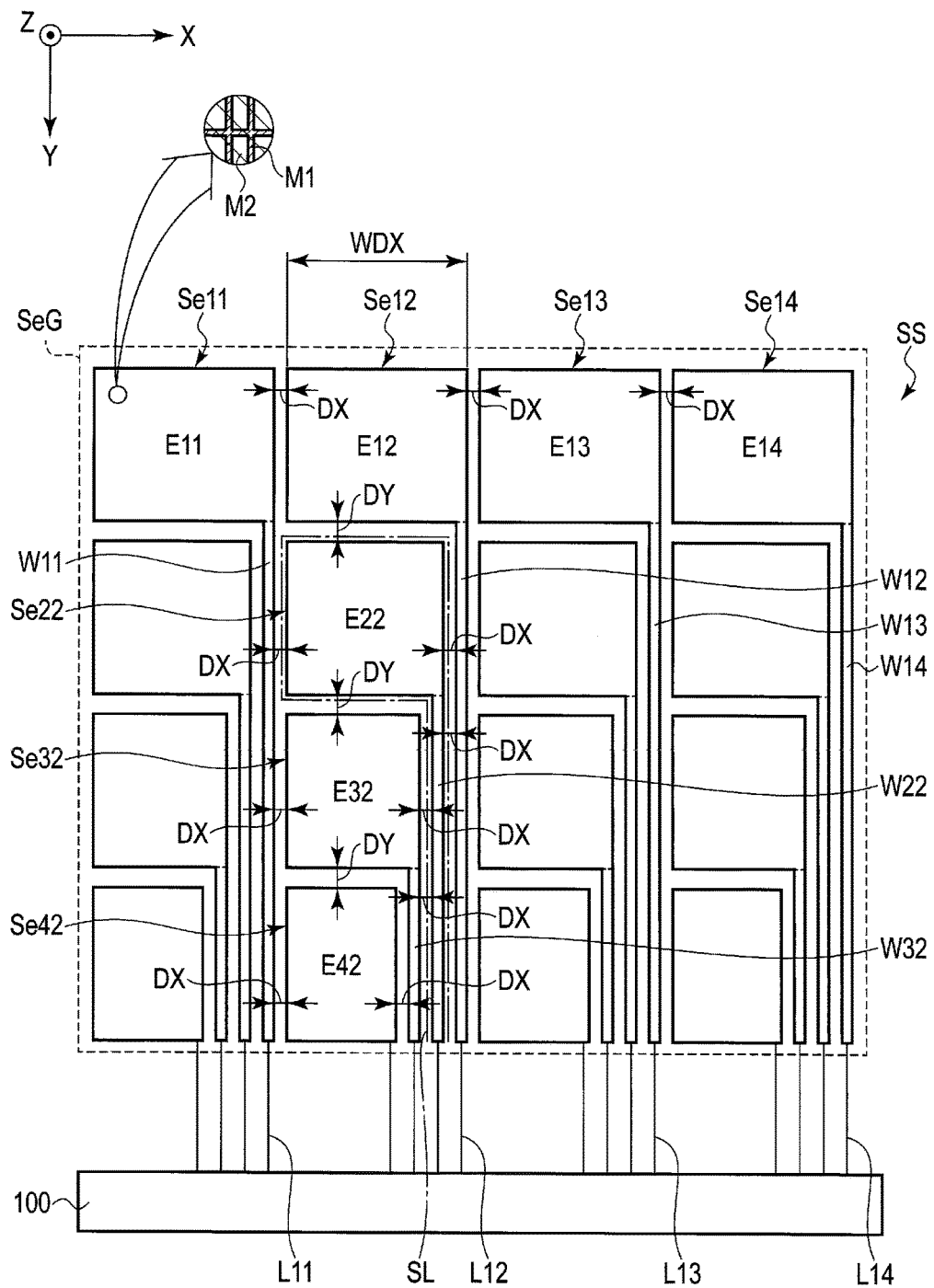
F I G. 3

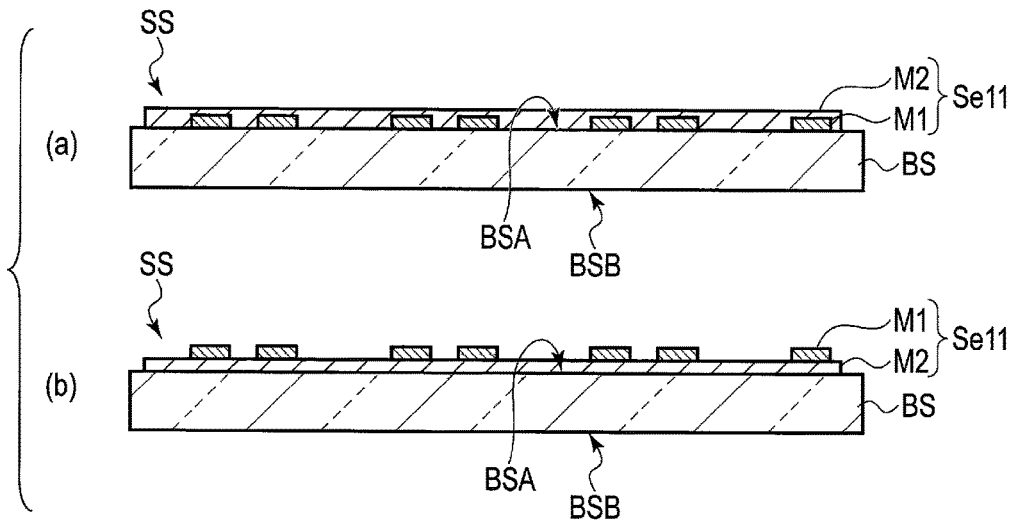
F I G. 4
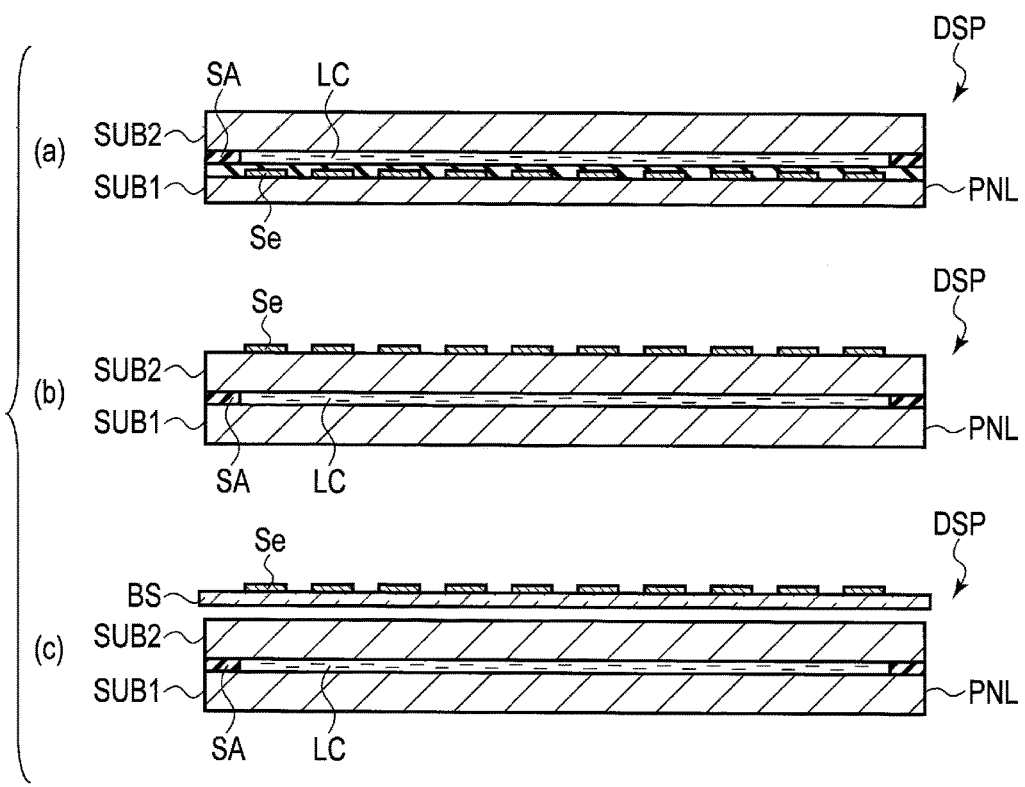
F I G. 5

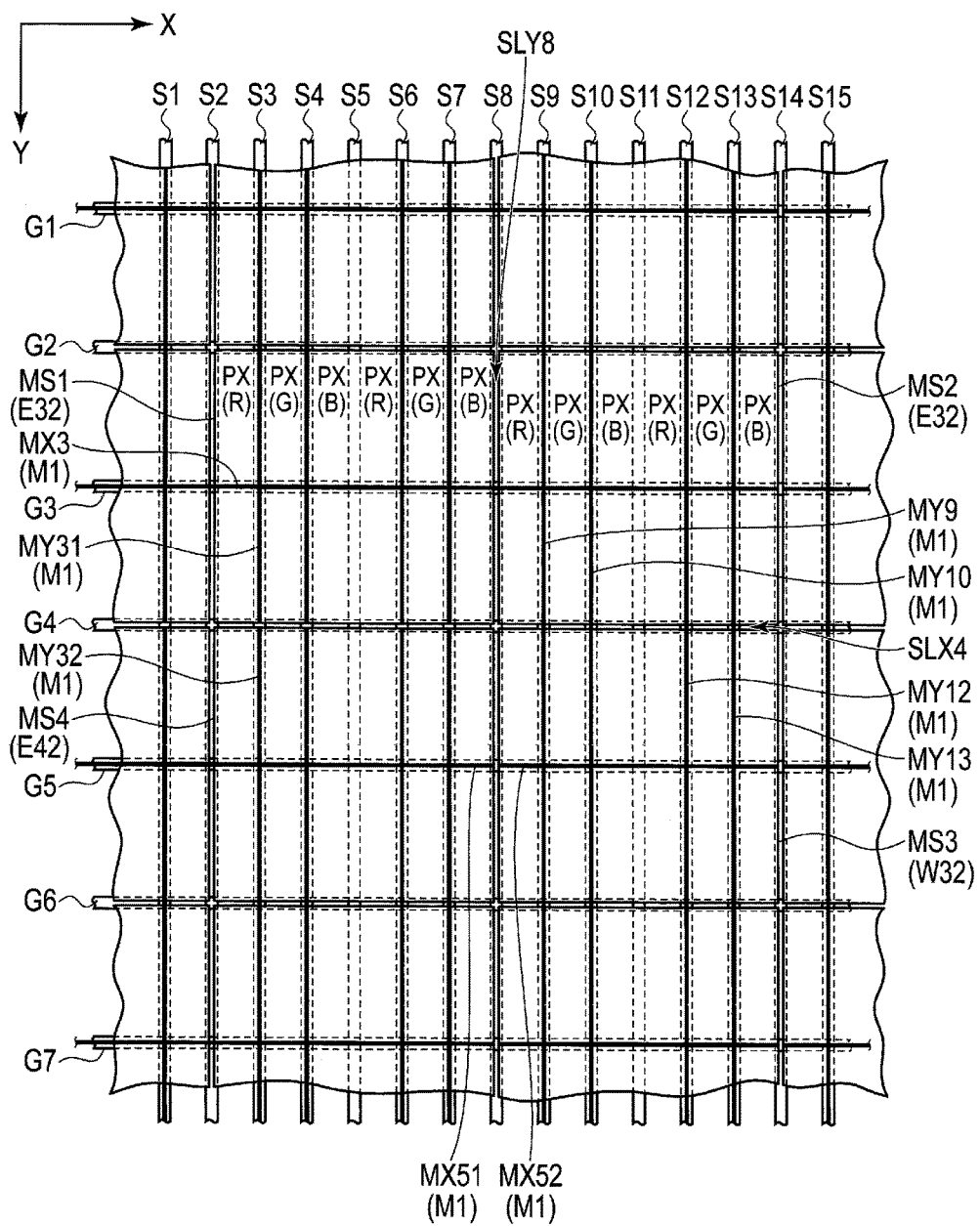
F I G. 11

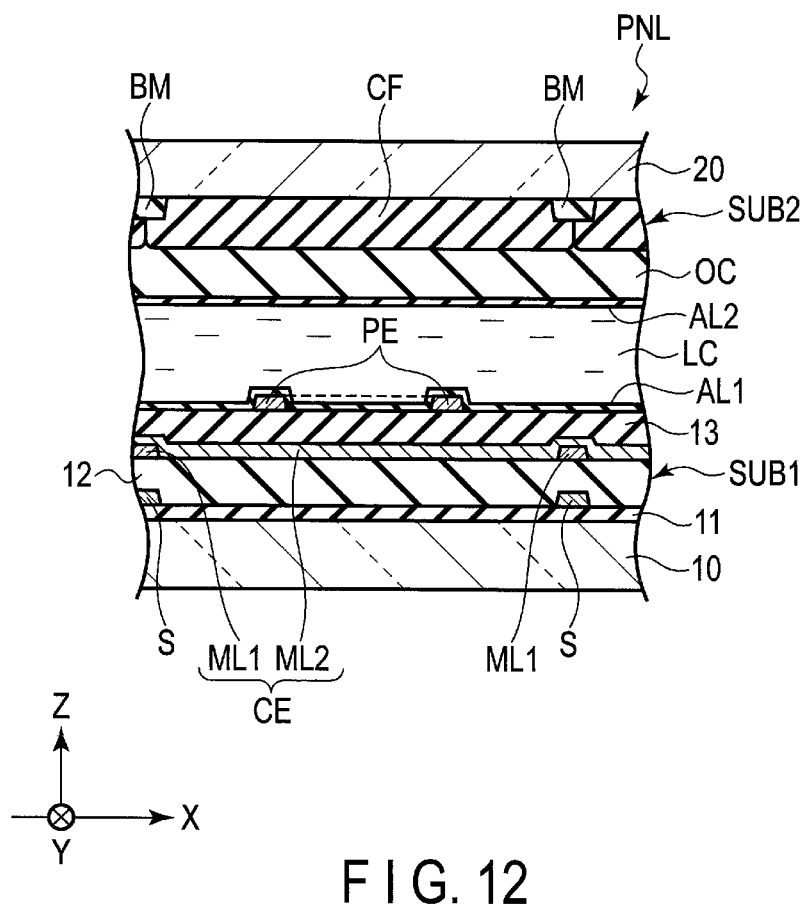
F I G. 12

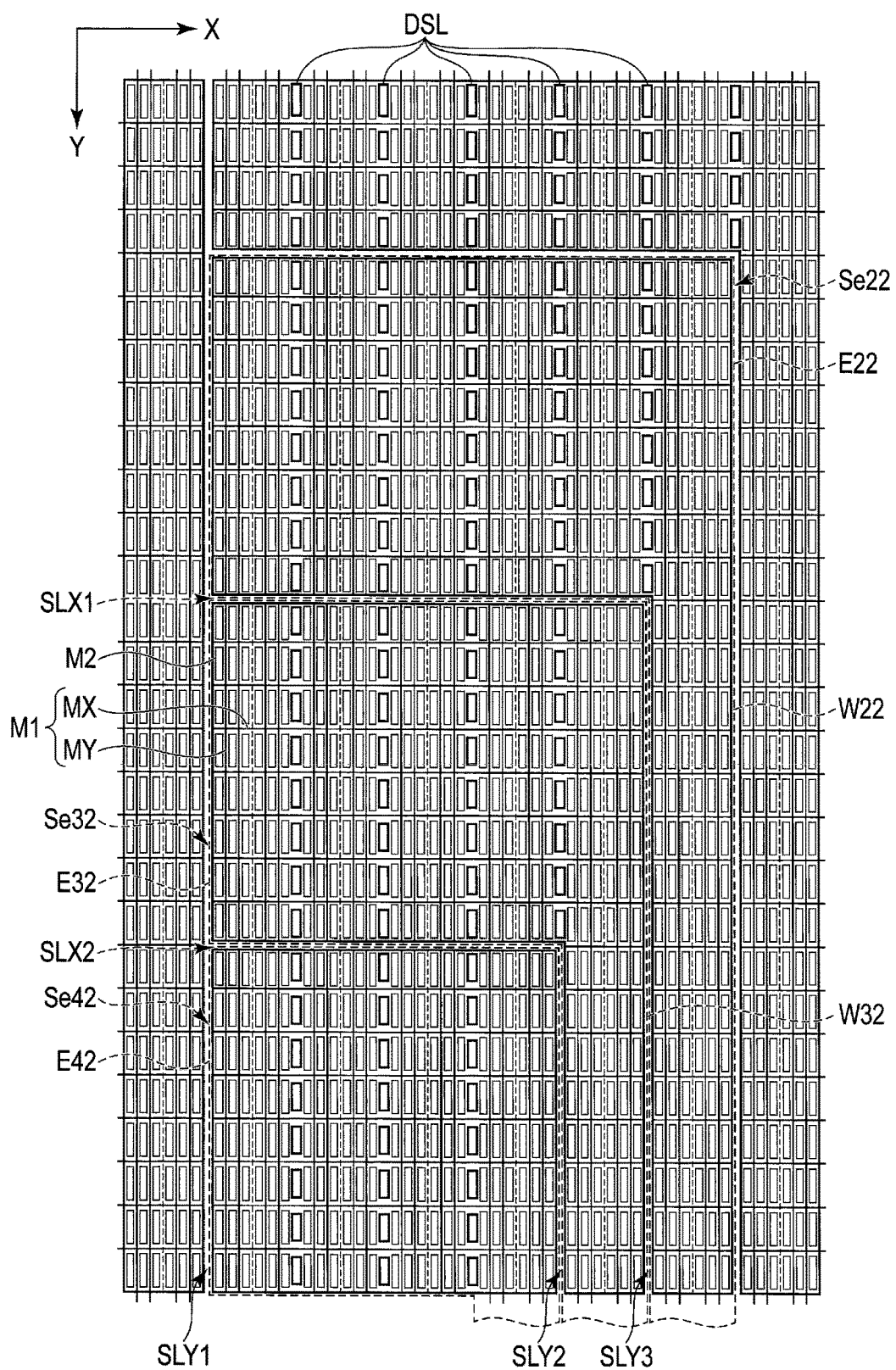
F I G. 13

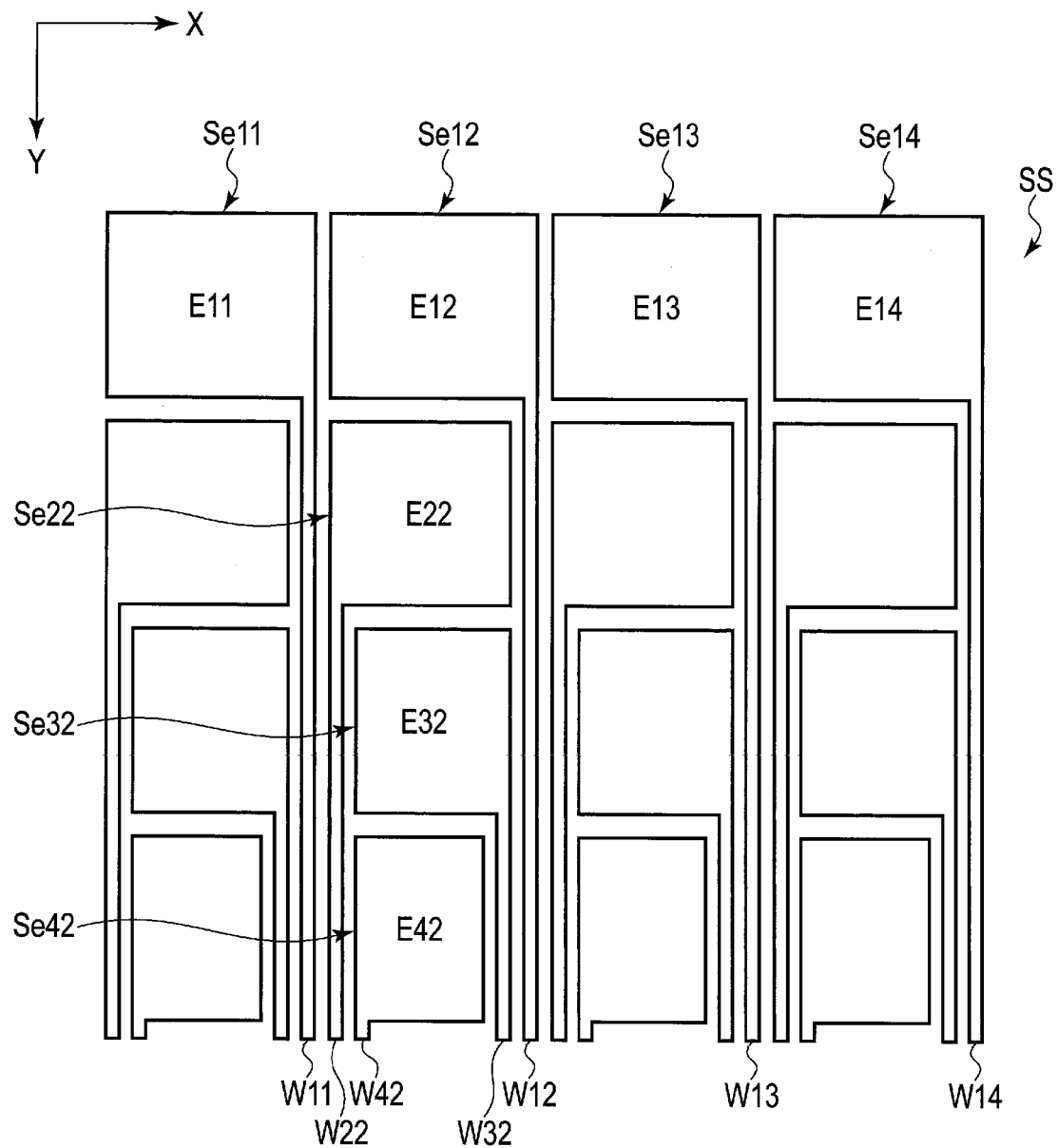
F I G. 15

F I G. 17

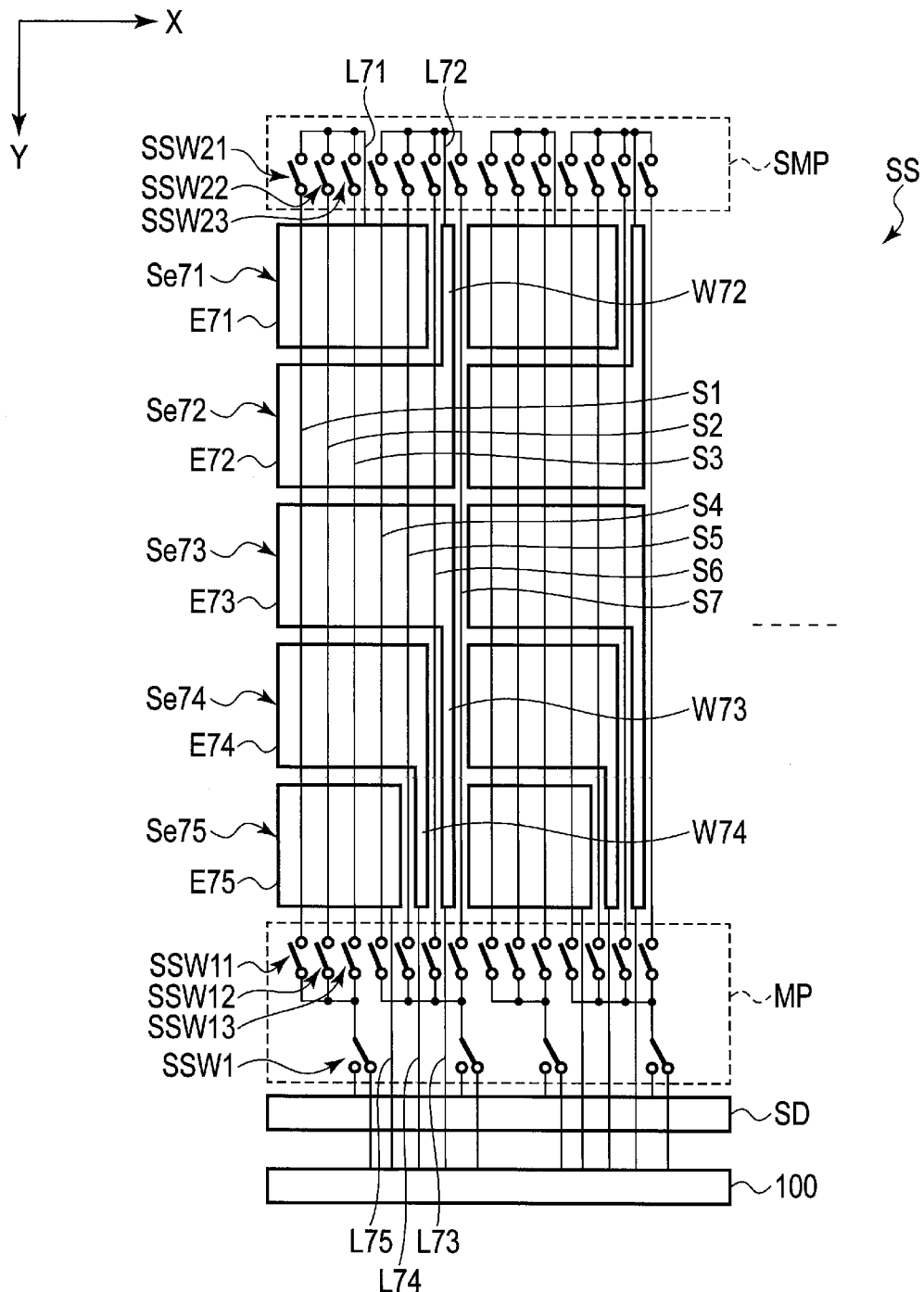
F I G. 20

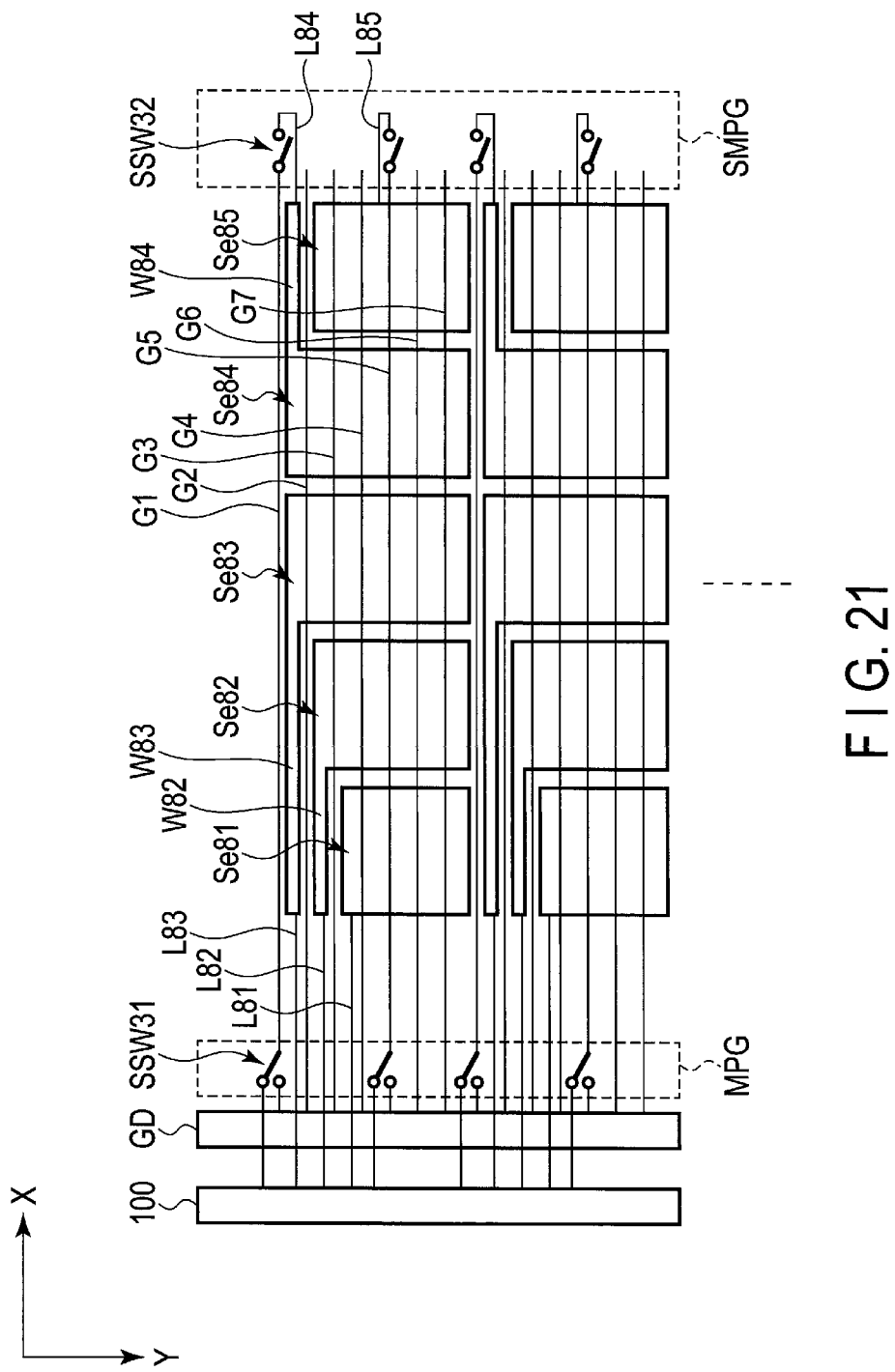
F I G. 21

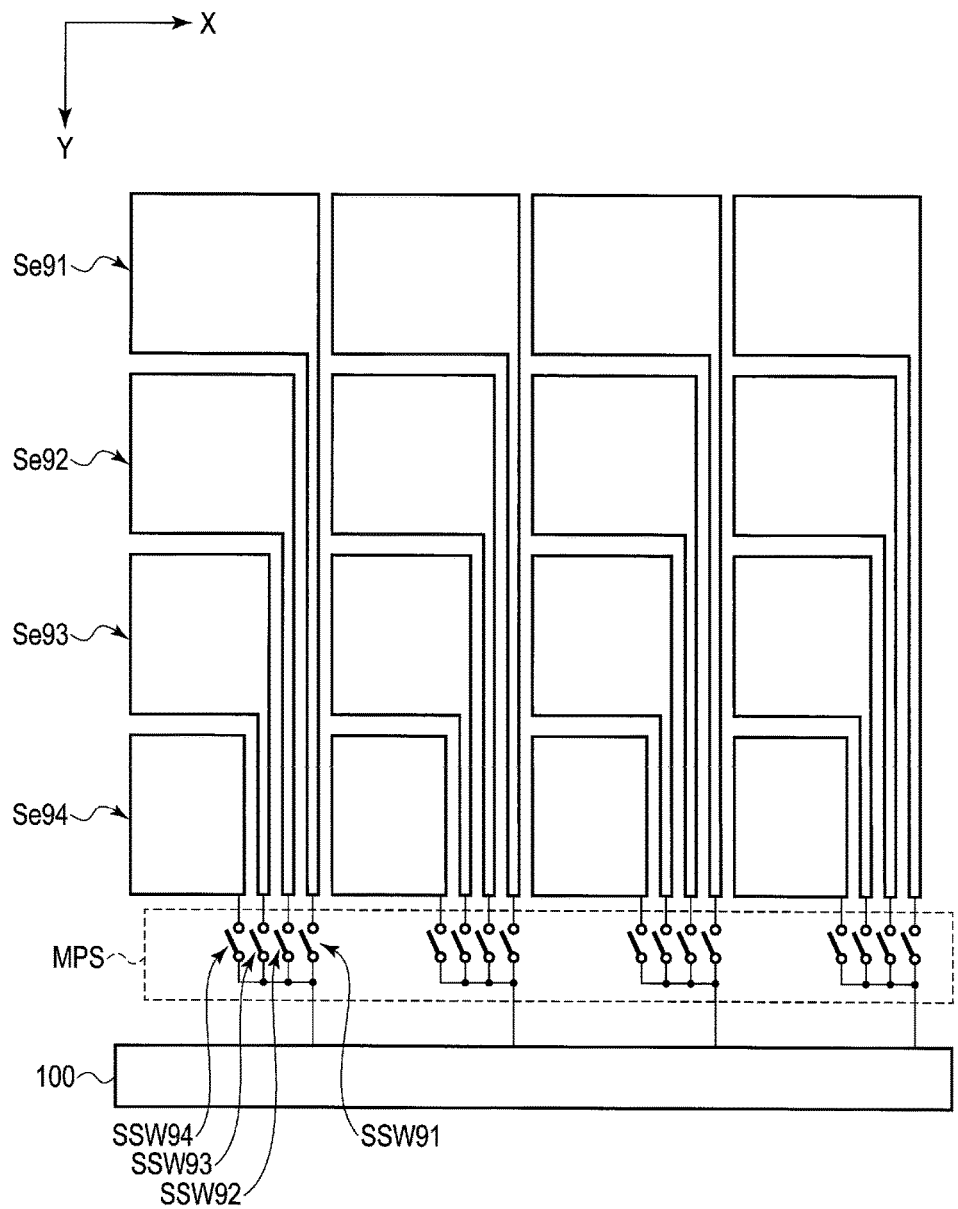
F I G. 22

SENSOR AND SENSOR-EQUIPPED DISPLAY DEVICE

CROSS-REFERENCE TO RELATED APPLICATIONS

This application is based upon and claims the benefit of priority from Japanese Patent Application No. 2016-063607, filed Mar. 28, 2016, the entire contents of which are incorporated herein by reference.

FIELD

Embodiments described herein relate generally to a sensor and a sensor-equipped display device.

BACKGROUND

Recently, a sensor capable of detecting the contact or approach of an object such as a finger has been put into practical use as a display device interface or the like. A capacitive touch panel, which is an example of the sensor, comprises an electrode to detect variation in electrostatic capacitance caused by the object. For example, a technology of forming a first sensor electrode and a second sensor electrode constituting the mutual-capacitive sensor of mesh-shaped thin metal wires has been known.

BRIEF DESCRIPTION OF THE DRAWINGS

FIG. 3 is an illustration showing a configuration example of a sensor SS of the present embodiments.

FIG. 4 is a cross-sectional view showing a configuration example of a sensor electrode Se11 shown in FIG. 3.

FIG. 5 is a cross-sectional view showing a configuration example of a display device DSP of the present embodiments.

FIG. 11 is an enlarged plan view showing area A including four sub-conductive layers MS shown in FIG. 10.

FIG. 12 is a cross-sectional view showing another configuration example of the display panel PNL shown in FIG. 1.

FIG. 13 is a plan view showing another configuration example of the sensor electrodes Se.

FIG. 15 is an illustration showing another configuration example of the sensor SS of the present embodiments.

FIG. 17 is an illustration showing another configuration example of the sensor SS of the present embodiments.

FIG. 20 is an illustration showing another configuration example of the sensor SS of the present embodiments.

FIG. 21 is an illustration showing another configuration example of the sensor SS of the present embodiments.

FIG. 22 is an illustration showing another configuration example of the sensor SS of the present embodiments.

DETAILED DESCRIPTION

Figure 1:
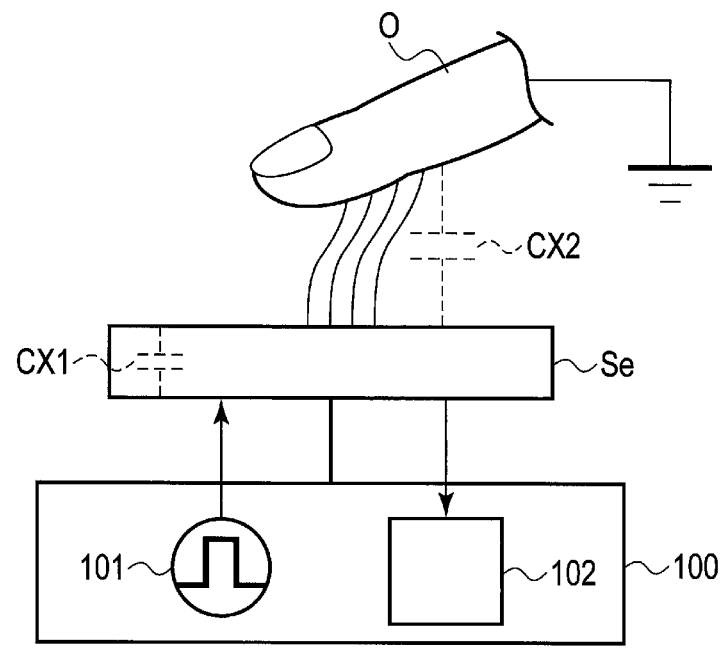
FIG. 1 is an illustration showing a summary of a self-capacitive touch detection.

In general, according to one embodiment, a sensor-equipped display device, include: an insulating substrate; pixel electrodes above the insulating substrate; a first sensor electrode comprising a first electrode portion and a first line portion connected to the first electrode portion; and a second sensor electrode comprising a second electrode portion and a second line portion connected to the second electrode portion, each of the first sensor electrode and the second sensor electrode being opposed to the pixel electrodes, the first sensor electrode being disposed at a position which does not overlap the second sensor electrode in planar view, each of the first sensor electrode and the second sensor electrode comprising a first conductive layer formed of a first member and a second conductive layer which is formed of a second member different from the first member and which is disposed on the first conductive layer.

According to another embodiment, a sensor, includes: a base substrate; a first sensor electrode comprising a first electrode portion and a first line portion connected to the first electrode portion above the base substrate; and a second sensor electrode comprising a second electrode portion and a second line portion connected to the second electrode portion above the base substrate, the first sensor electrode being disposed at a position which does not overlap the second sensor electrode in planar view, each of the first sensor electrode and the second sensor electrode comprising a first conductive layer formed of a first member and a second conductive layer which is formed of a second member different from the first member and which is disposed on the first conductive layer.

According to yet another embodiment, a sensor-equipped display device, includes: an insulating substrate; pixel electrodes above the insulating substrate; and sensor electrodes opposed to the pixel electrodes, each of the sensor electrodes comprising an electrode portion and a line portion connected to the electrode portion, each of the sensor electrodes comprising a first conductive layer formed of a first member and a second conductive layer which is formed of a second member different from the first member and which is disposed on the first conductive layer.

Embodiments are described hereinafter with reference to the accompanying drawings. The disclosure is merely an example, and proper changes in keeping with the spirit of the invention, which are easily conceivable by a person of ordinary skill in the art, come within the scope of invention as a matter of course. To better clarify the explanations, the drawings may schematically show width, thickness, shape, etc., of each portion as compared with the actual aspect, but they are mere examples and do not restrict the interpretation of the invention. Furthermore, in the specification and drawings, constituent elements having the same or similar functions as those described in connection with preceding drawings are denoted by like reference numerals and duplicated detailed explanations may be arbitrarily omitted.

First, a basic principle of touch detection of a self-capacitive mode (often referred to as a self-detection mode) applicable to a sensor and a sensor-equipped display device of the present embodiments will be explained.

FIG. 1 is an illustration showing a summary of a self-capacitive touch detection. The touch detection in the present specification corresponds to contact or approach of an object O to a detection surface of a sensor comprising a sensor electrode Se or a sensor-equipped display device, and this operation is often called sensing. The touch detection of the self-capacitance mode is performed by using capacitance Cx1 of the sensor electrode Se and capacitance Cx2 generated by the object O which approaches the sensor electrode Se. The sensor electrode Se is connected to a sensor controller 100. A specific configuration of the sensor electrode Se will be explained later. It should be noted that the object O is regarded as a dielectric such as a finger of a human or a pen.

The sensor controller 100 comprises a signal generator 101 and a detection circuit 102. The signal generator 101 generates a predetermined pulse wave as a sensor signal. The detection circuit 102 operates a difference from a threshold value (i.e., a variation in capacitance) based on a detection signal read from the sensor electrode Se. The sensor controller 100 supplies a sensor signal to the sensor electrode Se, reads a detection signal indicating a variation in the capacitance generated at each sensor electrode supplied with the sensor signal in accordance with the contact or approach of the object O, and performs touch detection.

Figure 2:
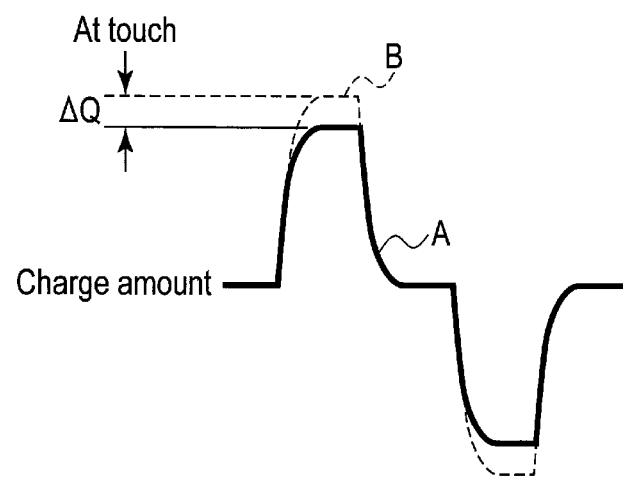
FIG. 2 is a chart for explanation of capacitance variation at self-capacitive touch detection.

FIG. 2 is a chart for explanation of capacitance variation at self-capacitive touch detection. In FIG. 2, a solid line A represents a time variation in the charge amount in a state in which the object O neither contacts nor approaches the sensor electrode Se. In this state, capacitance Cx1 alone is generated at the sensor electrode Se since no capacitance is generated between the sensor electrode Se and the object O. At this time, a current flows to the sensor electrode Se by capacitance Cx1 in accordance with supply of the sensor signal to the sensor electrode Se. For this reason, the charge amount of the sensor electrode Se indicates a time variation as represented by the solid line A.

A broken line B in FIG. 2 represents a time variation in the charge amount in a state in which the object O approaches the sensor electrode Se. In the state in which the object O contacts or approaches the sensor electrode Se, capacitance Cx1 is generated between the sensor electrode Se and the object O in addition to the capacitance Cx1 of the sensor electrode Se. At this time, much current flows to the sensor electrode Se for the capacitance Cx2 in accordance with the capacitance Cx1 in accordance with supply of the sensor signal to the sensor electrode Se. For this reason, the charge amount of the sensor electrode Se indicates a time variation as represented by the broken line B and generates a difference ΔQ as compared with the charge amount represented by the solid line A in which the object O does not exist. Since the capacitance variation is thus generated due to presence of the object O on the sensor electrode Se, the charge amount flowing to the sensor electrode Se is varied. The sensor controller 100 shown in FIG. 1 performs touch detection by detecting the difference ΔQ as shown in FIG. 2.

FIG. 3 is an illustration showing a configuration example of a sensor SS of the present embodiments. The first direction X, the second direction Y and the third direction Z illustrated in the figure are orthogonal to each other but may intersect at an angle other than ninety degrees. In the present specification, a state in which the sensor SS or the display device DSP to be explained later are visually recognized from the third direction Z is called a planar view.

The sensor SS comprises a sensor electrode group SeG including sensor electrodes Se. The sensor electrode group SeG includes sixteen sensor electrodes Se but the number of the sensor electrodes Se in the sensor electrode group SeG is not limited to the example illustrated. The sensor electrodes Se are disposed at positions which do not overlap each other in planar view.

In the example illustrated, the sensor electrode group SeG includes sensor electrodes Se11 to Se14 arranged in the first direction X and spaced apart as the sensor electrodes Se. Since the sensor electrodes Se11 to Se14 have the same structure, the structure of the sensor electrode Se11 will be explained here in more detail.

The sensor electrode Se11 comprises an electrode portion E11 and line portion W11 and is substantially shaped in letter L.

The sensor electrode Se11 corresponds to a first sensor electrode, the electrode portion E11 corresponds to a first electrode portion, and the line portion W11 corresponds to a first line portion. The electrode portion E11 is shaped in, for example, a rectangle having a pair of sides extending in the first direction X and a pair of sides extending in the second direction Y but is not limited to the example illustrated and may be in the other shape such as the other polygon. The electrode portion E11 is more expanded in the first direction X than the line portion W11. The line portion W11 is connected to the vicinity of one of corner portions of the electrode portion E11 and is formed in a strip shape extending in the second direction Y. The line portion W11 is connected to a lead line L11. The lead line L11 is connected to the sensor controller 100.

Similarly to this, the sensor electrode Se12 comprises an electrode portion E12 and a line portion W12, the sensor electrode Se13 comprises an electrode portion E13 and a line portion W13, and the sensor electrode Se14 comprises an electrode portion E14 and a line portion W14. The sensor electrode Se11 corresponds to a second sensor electrode, the electrode portion E12 corresponds to a second electrode portion, and the line portion W12 corresponds to a second line portion. The line portions W12 to W14 are connected to the sensor controller 100 via lead lines L12 to L14, respectively.

In addition to the sensor electrodes Se11 to Se 14, the other sensor electrodes Se are disposed such that the electrode portions E are arranged in a matrix in the first direction X and the second direction Y. For example, the electrode portions E11 to E14 are arranged in the first direction X and spaced apart from each other. The electrode portions E11 to E14 have the same shape and the same area. In addition, the electrode portion E12 of the sensor electrode Se11, the electrode portion E22 of the sensor electrode Se22, the electrode portion E32 of the sensor electrode Se32, and the electrode portion E42 of the sensor electrode Se42 are arranged in the second direction Y and spaced apart from each other. The area of the electrode portion E22 is smaller than the area of the electrode portion E12, the area of the electrode portion E32 is smaller than the area of the electrode portion E22, and the area of the electrode portion E42 is smaller than the area of the electrode portion E32.

Attention will be focused on the sensor electrodes Se12, Se22, Se32 and Se42. The electrode portions E12, E22, E32, and E42 are arranged in the second direction Y. The electrode portion E12 is arranged with the electrode portion E11 in the first direction X. The electrode portions E22, E32, and E42 are arranged with the line portion W11 in the first direction X. The line portions W12, W22, and W32 extend in the second direction Y. The line portions W12 is arranged with the electrode portion E22 and the line portion W22 in the first direction X. The line portions W22 is arranged with the electrode portion E32 and the line portion W32 in the first direction X. The line portion W32 is arranged with the electrode portion E42 in the first direction X.

The sensor electrodes Se12, Se22, Se32 and Se42 are disposed not to extend off a region defined by a width WDX of the electrode portion E12 in the first direction X. End portions of the respective electrode portions E12, E22, E32, and E42 on a side adjacent to the sensor electrode Se11 are located in a straight line in the second direction Y.

For example, an interval DX between the electrode portions E11 and E12 in the first direction X, an interval DX between the electrode portions E12 and E13 in the first direction X and an interval DX between the electrode portions E13 and E14 in the first direction X are the same as each other. In the sensor electrode Se22, intervals between the electrode portion E22 and the line portions W11 and W12, and the interval DX between the line portions W12 and W22 are the same as each other. In the sensor electrode Se32, intervals between the electrode portion E32 and the line portions W11 and W22, and the interval DX between the line portions W22 and W32 are the same as each other. In the sensor electrode Se42, intervals DX between the electrode portion E42 and the line portions W11 and W32 are the same as each other.

In addition, intervals DY between the electrode portions E12 and E22, between the electrode portions E22 and E32 and between the electrode portions E32 and E42 in the second direction Y are the same as each other. The interval DY is the same as the interval DX.

Each of the sensor electrodes Se at the electrode portions E and the line portions W comprises a first conductive layer M1 formed of a first member and a second conductive layer M2 formed of a second member different from the first member. The second conductive layer M2 is deposited on the first conductive layer M1. The first member and the second member are different in resistivity or dielectric constant. Sectional structures of the sensor electrodes Se and details of the members will be explained later. In FIG. 3, an enlarged view of a part of the electrode portion E11 is illustrated. The first conductive layer M1 corresponds to a portion where hatch lines are drawn in a right upward direction and the second conductive layer M2 corresponds to a portion where hatch lines are drawn in a right downward direction. The first conductive layer M1 and the second conductive layer M2 are overlaid in planar view. The first conductive layer M1 is formed as wires and is formed in a lattice shape extending in the first direction X and the second direction Y in the example illustrated. The first conductive layer M1 may be formed in a stripe shape extending in the first direction X alone or the second direction Y alone and may extend in at least one of the first direction X and the second direction Y, though explained later. The second conductive layer M2 is formed in a flat plate shape extending in the first direction X and the second direction Y to cover the first conductive layer M1. As explained, the first conductive layer M1 is formed in a wire shape, the second conductive layer M2 is formed in a flat plate shape, and the width of the second conductive layer M2 is greater than the width of the first conductive layer M1. The width indicates a length in a direction orthogonal to the extending direction of the first conductive layer M1.

Each of the first conductive layer M1 and the second conductive layer M2 is cut between the adjacent sensor electrodes Se. In other words, the adjacent sensor electrodes Se are separated by a slit formed in the first conductive layer M1 and the second conductive layer M2. For example, the sensor electrode Se22 is separated from each of the sensor electrodes Se11, Se12 and Se32 by a slit SL represented by a one-dot-chained line in the figure. The intervals DX and DY can be regarded as widths of the slits between the adjacent sensor electrodes Se.

In the example illustrated, the sensor electrode group SeG includes the sensor electrodes having different areas, but the areas of the sensor electrodes Se may be made equal by varying the ratio of the longitudinal length to the lateral length (or the ratio of the length in the first direction X to the length in the second direction Y) in the electrode portions E in response to the location of the sensor electrodes Se.

FIG. 4 is a cross-sectional view showing a configuration example of a sensor electrode Se11 shown in FIG. 3.

The sensor electrode Se11 is located on a base substrate BS. In the configuration example shown in FIG. 4(a), the first conductive layer M1 of the sensor electrode Se11 is located on an upper surface BSA of a base substrate BS, the second conductive layer M2 is directly deposited on the first conductive layer M1, and the first conductive layer M1 and the second conductive layer M2 are electrically connected to each other. In other words, an intermediate layer such as an insulating layer is not interposed between the first conductive layer M1 and the second conductive layer M2. The second conductive layer M2 is disposed to cover the first conductive layer M1 and is also located on the upper surface BSA of a base substrate BS. In the configuration example shown in FIG. 4(b), the second conductive layer M2 is located on the upper surface BSA of the base substrate BS and the first conductive layer M1 is directly disposed on the second conductive layer M2.

In any one of the configuration examples illustrated, an insulating layer may be interposed between the base substrate BS and the sensor electrode Se11. In other words, another intermediate layer may be between the first conductive layer M1 and the second conductive layer M2. An intermediate layer may be between the first conductive layer M1 and the second conductive layer M2, and the first conductive layer M1 and the second conductive layer M2 may be electrically connected through a contact hole formed in the insulating layer. A protective member covering the sensor electrode Se11 may be disposed though not shown in the figure.

In the sensor SS, a lower surface BSB of the base substrate BS or a surface of the sensor electrode Se11 corresponds to a detection surface. The surface of the sensor electrode Se11 corresponds to an upper surface of the second conductive layer M2 in the configuration example shown in FIG. 4(a), corresponds to an upper surface of the first conductive layer M1 and the second conductive layer M2 in the configuration example shown in FIG. 4(b), and corresponds to an upper surface of the protective member in the example of providing the protective member.

A first member forming the first conductive layer M1 is a metal member and, for example, a metal such as aluminum (Al), titanium (Ti), silver (Ag), molybdenum (Mo), tungsten (W), copper (Cu) or chromium (Cr), an alloy formed of a combination of the metal materials, and the like can be used as the metal material. The first conductive layer M1 may be a single-layer body or a multi-layered body formed by depositing metal materials. The lead lines L shown in FIG. 3 can also be formed of the same first member as the first conductive layer M1. A second member forming the second conductive layer M2 is a transparent conductive member formed of an oxide such as indium tin oxide (ITO), indium zinc oxide (IZO) or the like. The first conductive layer M1 is desirably nonvisualized by plating with a black member or the like.

Next, a sensor-equipped display device DSP of the present embodiments will be explained. In the present embodiments, a liquid crystal display device is explained as an example of the display device. The major configuration explained in the present embodiments can also be applied to a self-luminous display device comprising an organic electroluminescent (EL) element and the like, an electronic paper display device comprising a cataphoretic element and the like, a display device employing micro-electro-mechanical systems (MEMS), or a display device employing electrochromism.

FIG. 5 is a cross-sectional view showing a configuration example of the display device DSP of the present embodiments.

The display device DSP comprises a display panel PNL. The display panel PNL is, for example, a liquid crystal display panel. The display panel PNL includes a first substrate SUB1, a second substrate SUB2 and a liquid crystal layer LC which functions as a display function layer. The first substrate SUB1 and the second substrate SUB2 are attached to each other by a sealing member SA. The liquid crystal layer LC is held between the first substrate SUB1 and the second substrate SUB2.

In the configuration example shown in FIG. 5(a), the sensor electrodes Se are built in the display panel PNL and the first substrate SUB1 corresponds to the base substrate. In the configuration example shown in FIG. 5(b), the sensor electrodes Se are formed on the display panel PNL and the second substrate SUB2 corresponds to the base substrate. In the configuration example shown in FIG. 5(c), the sensor electrodes Se are disposed separately from the display panel PNL and are formed on the base substrate BS which is opposed to the second substrate SUB2. This base substrate BS is a transparent glass substrate or a resin substrate.

The display panel PNL of the present embodiments may be any one of the transmissive display panel, the reflective display panel and the transflective display panel. The display device DSP using the transmissive display panel PNL comprises a lighting unit, for example, a backlight unit (not shown) on a back side of the first substrate SUB1 and has a transmissive display function of displaying images by selectively transmitting the light from the backlight unit. The display device DSP using the reflective display panel PNL has a reflective display function of displaying images by selectively reflecting the light from the front side (or the display surface side) of the second substrate SUB2. An auxiliary light source may be disposed on the front surface side of the reflective display panel PNL. The display device DSP using the transflective display panel PNL has both the transmissive display function and the reflective display function.

Next, a configuration example of the display device DSP of the present embodiments will be explained in more detail. In the configuration example, the sensor electrodes Se are built in the display panel PNL.

Figure 6:
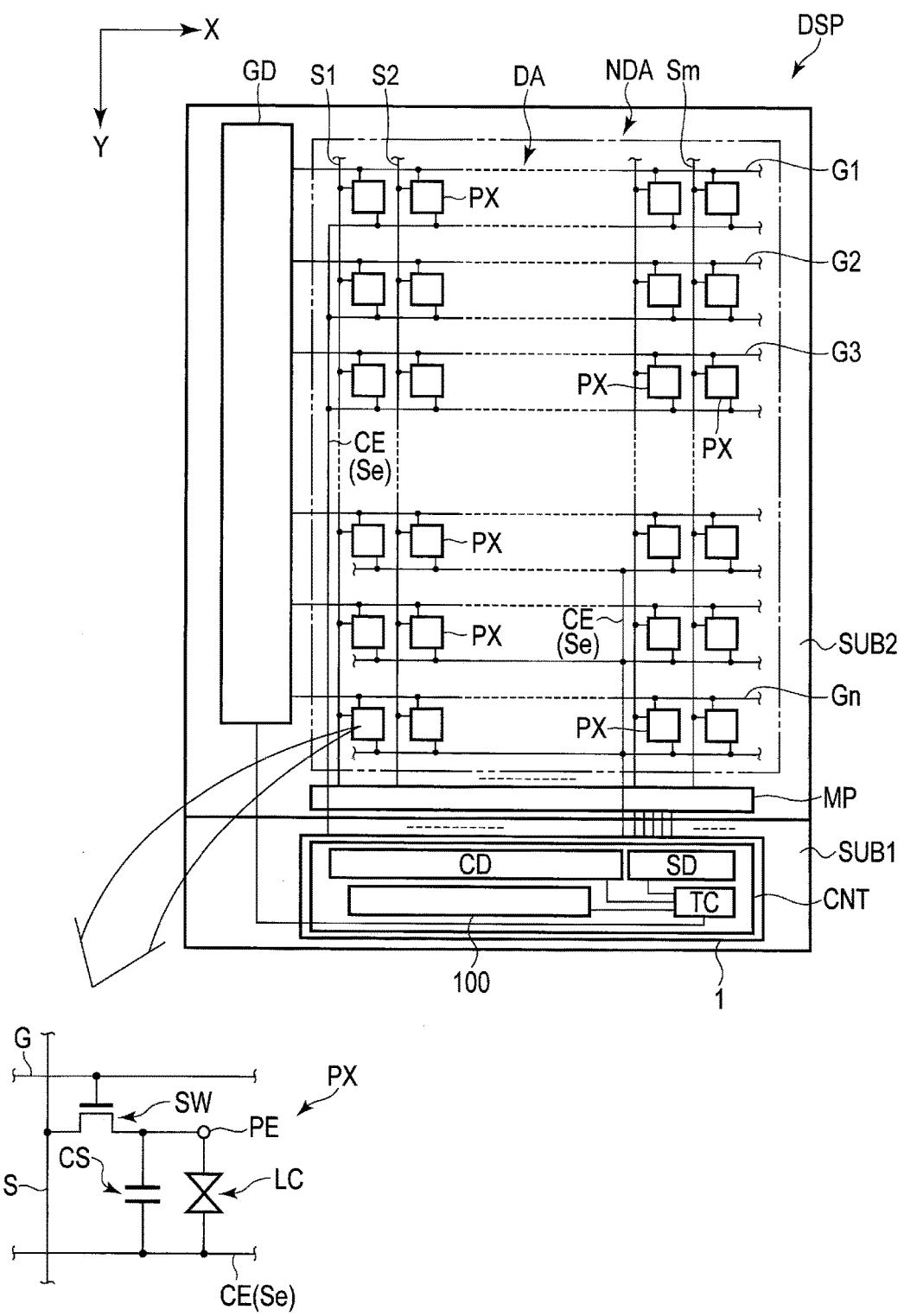
FIG. 6 is a diagram showing a basic structure and an equivalent circuit, of a display panel PNL constituting a display device DSP of the present embodiments.

FIG. 6 is a diagram showing a basic configuration and an equivalent circuit, of the display panel PNL constituting the display device DSP of the present embodiments.

The display panel PNL includes a display area DA on which an image is displayed and a frame-shaped non-display area NDA which surrounds the display area DA. The display area DA is shaped in a rectangle in the example illustrated, but may be formed in the other polygon, a circle, an ellipsoid or the other shape.

The display panel PNL includes pixels PX in the display area DA. The pixel PX indicates a minimum unit which can be controlled independently in response to the pixel signal and exists in, for example, a region including a switching element SW disposed at a position at which the scanning line G and the signal line S intersect. The pixel PX is often called a sub-pixel. In addition, a minimum unit for implementing the color display is called a main pixel. The main pixel is configured to comprise sub-pixels PX which exhibit different colors. For example, the main pixel comprises a red pixel which exhibits a red color, a green pixel which exhibits a green color, and a blue pixel which exhibits a blue color as the sub-pixels. The colors exhibited by the sub-pixels PX constituting the main pixel are not limited to red, green and blue, but may be composed of complementary colors such as yellow, cyan and magenta. The number of colors exhibited by the sub-pixels PX constituting the main pixel is not limited to this, but may exhibit black and white or four colors or more. For example, the main pixel is often configured to comprise a sub-pixel which exhibits the other color such as white in addition to the above-explained three sub-pixels.

The pixels PX are arrayed in a matrix in the first direction X and the second direction Y. In addition, the display panel PNL includes scanning lines G (G1 to Gn), signal lines S (S1 to Sm), a common electrode CE and the like, in the display area DA. The scanning lines G extend in the first direction X so as to be arranged in the second direction Y. The signal lines S extend in the second direction Y so as to be arranged in the first direction X. The scanning lines G and the signal lines S do not need to extend linearly but may be partially bent. The common electrodes CE are disposed not to be overlaid on each other in planar view, in the display area DA, though described later in detail. One common electrode CE is disposed over the pixels PX. Each of the common electrodes CE also functions as a sensor electrode Se for touch detection.

Each pixel PX comprises a switching element SW, a pixel electrode PE, the common electrode CE, a liquid crystal layer LC and the like. The switching element SW is constituted by, for example, a thin-film transistor (TFT) and is electrically connected to the gate line G and the source line S. More specifically, the switching element SW comprises a gate electrode, a source electrode and a drain electrode. The gate electrode is electrically connected to the scanning line G. Either of the source electrode and the drain electrode is electrically connected to the signal line S. The other of the source electrode and the drain electrode is electrically connected to the pixel electrode PE. The scanning line G is connected to the switching element SW in each of the pixels PX arranged in the first direction X. The scanning line G is connected to the switching element SW in each of the pixels PX arranged in the second direction Y. Each of the pixel electrodes PE is opposed to the common electrode CE and drives the liquid crystal layer LC by an electric field formed between the pixel electrode PE and the common electrode CE. A storage capacitor CS is formed, for example, between the common electrode CE and the pixel electrode PE.

The display panel PNL comprises a drive controller DCNT to implement a touch detecting function of detecting touch of the object O on the display panel PNL, in addition to the function of displaying the images on the display area DA. The drive controller DCNT comprises a scanning line driver GD, a select circuit MP and a main controller CNT in the non-display area NDA in the figure. The scanning line driver GD is connected to each of the scanning lines G drawn to the non-display area NDA and drives each scanning line G. The select circuit MP is connected to each of the signal lines S drawn to the non-display area NDA and controls the output of the pixel signal to the signal line S. The main controller CNT controls the scanning line driver GD and the select circuit MP. For example, the scanning line driver GD and the select circuit MP are formed on the first substrate SUB1 and the main controller CNT is built in an IC chip 1 mounted on the first substrate SUB1. the scanning line driver GD and the select circuit MP are electrically connected to the main controller CNT.

The main controller CNT comprises a common electrode driver CD, a signal line driver SD, a sensor controller 100, a timing controller TC, and the like. The common electrode driver CD is connected to each of the common electrodes CE drawn to the non-display area NDA and drives each common electrode CE. The signal line driver SD is connected to each of the signal lines S via the select circuit MP and drives each signal line S. The sensor controller 100 is connected to each of the sensor electrodes Se and drives each sensor electrode Se, though explained later. The timing controller TC controls drive timing of the scanning line driver GD, the select circuit MP, the common electrode driver CD, the signal line driver SD, the sensor controller 100 and the like.

In the above-explained configuration, for example, the scanning line driver GD, the select circuit MP, the common electrode driver CD, the signal line driver SD, and the timing controller TC function as display drive controllers which controls the drive to display the images in the display area DA. In addition, the sensor controller 100, the common electrode driver CD and the timing controller TC function as sensor drive controllers which control the drive to execute detection of touch of the object O on the display panel PNL.

Figure 7:
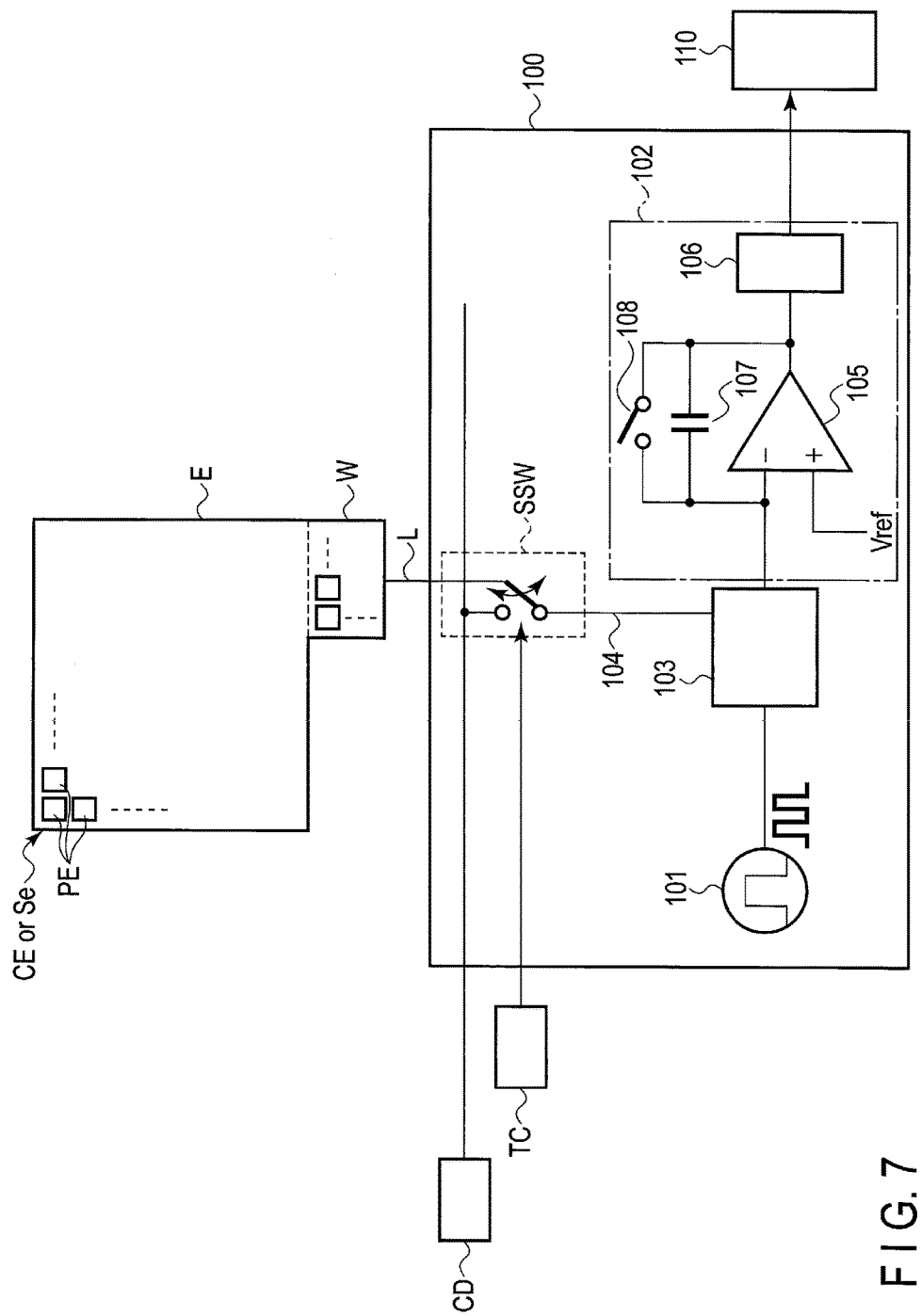
FIG. 7 is a diagram schematically showing a circuit configuration of a sensor controller 100.

FIG. 7 is a diagram schematically showing a circuit configuration of the sensor controller 100. An example of a connection between the sensor electrode Se (or the common electrode CE) and the sensor controller 100 will be explained, but the sensor controller 100 is connected to the sensor electrodes Se and has a circuit configuration as explained below, for each sensor electrode Se.

The sensor controller 100 is a circuit which implements the touch detection in the self-capacitive mode and comprises a signal generator 101, a detection circuit 102, and a mirror circuit 103. The signal generator 101 generates a predetermined pulse wave as a sensor signal. The mirror circuit (current mirror circuit) 103 has an upstream side connected to the signal generator 101 and a downstream side connected to a line 104 and the detection circuit 102. Thus, when the sensor signal is supplied from the signal generator 101 to the line 104, the same signal as the sensor signal is also input to the detection circuit 102.

The detection circuit 102 comprises a comparator 105 and an A/D converter 106. The comparator 105 receives the sensor signal via the mirror circuit 103 and outputs a difference from a threshold value Ref. A capacitor 107 and a switch 108 are connected to the comparator 105 in parallel. The output of the comparator 105 is reset by changing the switch 108. Change of the switch 108 is controlled by the timing controller TC. The A/D converter 106 converts the analog value output from the comparator 105 into digital signal data and outputs the data to an external control module (application processor) 110. The control module 110 executes various types of processing based on the data from the detection circuit 102. The control module 110 is, for example, connected with the main controller CNT via a printed wiring board, for example, a flexible printed circuit, which is connected to the first substrate SUB1 in FIG. 3. The control module 110 supplies video data, various control signals and the like required to display the images in the display area DA to the main controller CNT, though not described in detail.

The common electrode driver CD supplies a common drive signal set at a predetermined potential such as a ground potential (GND).

The sensor electrode Se (or the common electrode CE) comprises an electrode portion E and a line portion W. The electrode portion E and the line portion W are opposed to the pixel electrodes PE. The lead line L connected to the line portion W is connected to a select switch SSW. The common electrode driver CD and the sensor controller 100 are selectively connected to the lead line L by the select switch SSW. Change of the select switch SSW is controlled by the timing controller TC. When the lead line L is connected to the common electrode driver CD by the select switch SSW, the common drive signal is supplied from the common electrode driver CD to the common electrode CE. When the lead line L is connected to the sensor controller 100 via the line 104 by the select switch SSW, the sensor signal is supplied from the sensor controller 100 to the sensor electrode Se and the detection signal corresponding to the capacitance variation from the sensor electrode Se is detected by the sensor controller 100.

Figure 8:
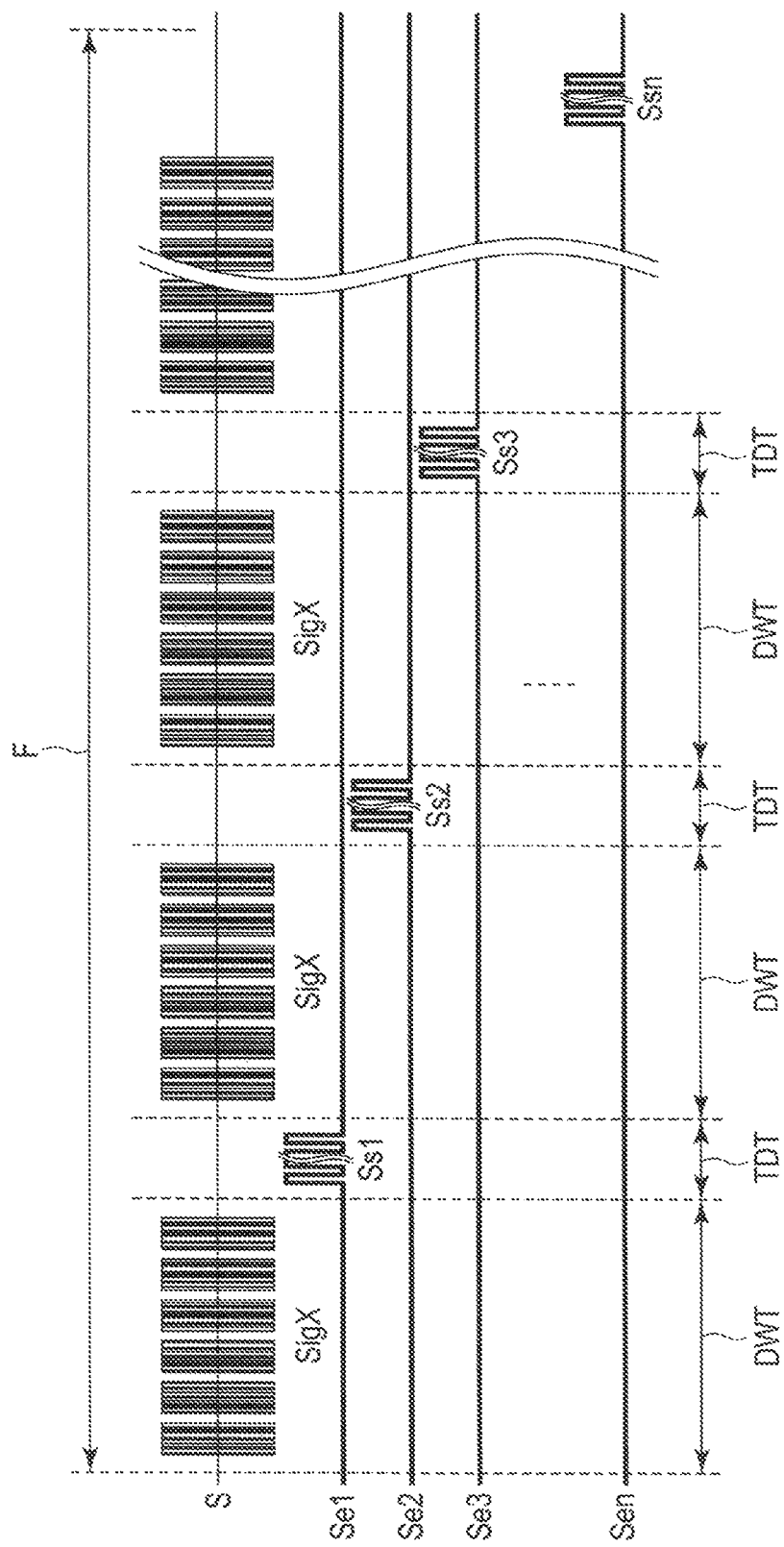
FIG. 8 is a timing chart showing a drive order of the display device DSP of the present embodiments.

FIG. 8 is a timing chart showing a drive order of the display device DSP of the present embodiments.

A frame period F is set to be a period in which a display period DWT (including a period for writing the pixel signal SigX from the signal line S) and a detection period TDT (often called a non-display period) for executing the touch detection (sensing) are different from each other. More specifically, the frame period F includes the display periods DWT, and the detection period TDT is set between the display period DWT and the display period DWT. In the detection period TDT, sensor electrodes Se1, Se2, Se3, Sen separated from each other are driven by sensor signals Ss1, Ss2, Ss3, . . . Ssn. One sensor electrode Se is regarded as one detection block and the sensor signals Se are driven by the respective sensor signals Ss but, a plurality of sensor electrodes Se may be regarded as one detection block and driven by the same sensor signal Ss at the same timing.

If the object is contacting or approaching the detection surface when the sensor electrodes Se1, Se2, Se3, . . . are driven by sensor signals Ss1, Ss2, Ss3, . . . , a detection signal of different level as compared with a case where the object does not exist on the detection surface is output from the sensor electrode Se corresponding to the position of the object. The display periods DWT and the touch detection periods TDT are dispersed at a plurality of positions in the frame period F. In other words, the display periods DWT and the touch detection periods TDT are divided in time in the frame period F. The display periods DWT and the touch detection periods TDT are alternately set at a plurality of times in one frame period in the above example, but the setting of the periods is not limited to this. For example, a first half period of the frame period may be regarded as the display period DWT and a second half period may be regarded as the touch detection period TDT.

The sensor controller 100 may change a touch detection frequency in accordance with the frequency change signal. The touch detection frequency is a frequency with which the detection surface is scanned in a period of the frame (60 Hz). For example, if the detection signal Ss of a predetermined level cannot be obtained in a general operation, the sensor controller 100 sets the touch detection frequency at 120 Hz, based on, for example, the frequency change signal which urges the touch detection frequency to be set at 120 Hz. Then, when some noise (detection signal Ss) is detected, the sensor controller 100 sets the touch detection frequency at 60 Hz, based on the frequency change signal which urges the touch detection frequency to be set at 60 Hz. The touch detection time can be thereby set to be longer and the touch detection sensitivity can be made higher. Thus, the sensor controller 100 of the present embodiments can change the touch detection frequency under conditions that the touch detection signal is not input for a certain period, and the like.

In addition, the sensor electrode group SeG explained with reference to FIG. 3 includes the sensor electrodes (for example, the sensor electrodes Se12 and Se22) different in area of the electrode portion E. In the sensor electrodes Se, the signal levels of the detection signals are often different due to a difference in area when the same object O is detected. In this case, the sensor controller 100 may correct the signal level in accordance with the area of the driving sensor electrode Se. Parameters for correction can be preset in accordance with the areas of the sensor electrodes Se and the sensor controller 100 can comprise a correction circuit corresponding to each parameter. When the sensor controller 100 executes touch detection with the sensor electrode group SeG, the sensor controller 100 desirably executes touch detection by sequentially driving the sensor electrodes Se having the same area. For example, the sensor electrodes having the same area as the sensor electrode Se12 shown in FIG. 3 (i.e., the sensor electrodes Se11, Se12, Se13 and Se14 in the figure) are driven sequentially and then the sensor electrodes having the same area as the sensor electrode Se22 are driven sequentially. Frequency of the change of the correction circuit can be thereby reduced.

Figure 9:
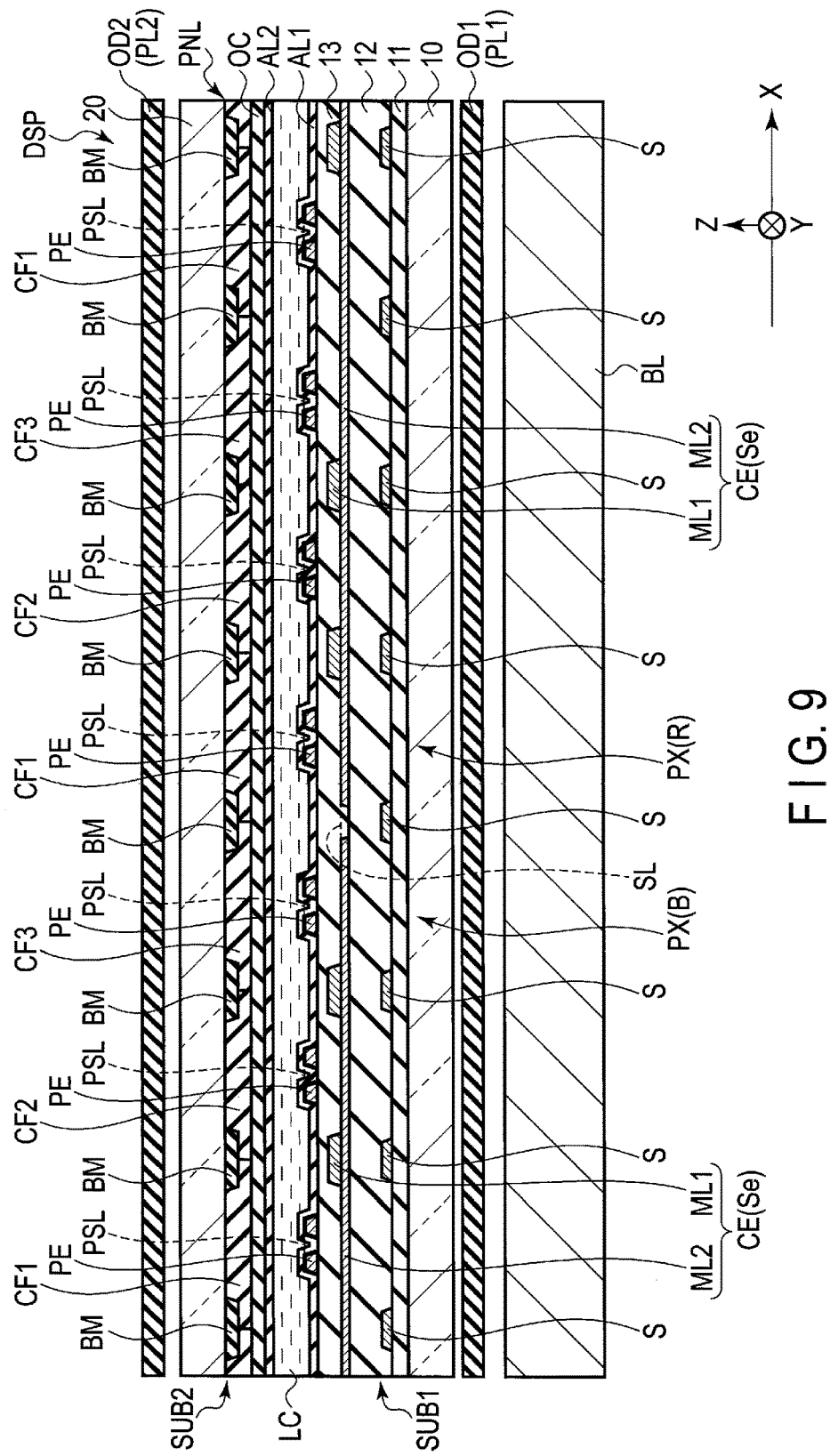
FIG. 9 is a cross-sectional view showing a partial structure of the display panel PNL shown in FIG. 1.

FIG. 9 is a cross-sectional view showing a partial structure of the display panel PNL shown in FIG. 1. The figure shows a cross-sectional view showing a section of the display device DSP seen along the first direction X. In the present specification, a direction from the first substrate SUB1 to the second substrate SUB2 is called an upward direction (or, more simply, upwardly) and a direction from the second substrate SUB2 to the first substrate SUB1 is called a downward direction (or, more simply, downwardly). A view from the second substrate SUB2 to the first substrate SUB1 is called a planar view.

The illustrated display panel PNL may be configured to correspond to a display mode using a lateral electric field which is parallel chiefly to the main substrate surface or a display mode using a longitudinal electric field perpendicular to the main surface of the substrate, an electric field angled to the main surface of the substrate or a combination thereof. In the display mode using the lateral electric field, for example, either of the first substrate SUB1 and the second substrate SUB2 can be configured to comprise both the pixel electrode PE and the common electrode CE. In the display mode using the lateral electric field or the oblique electric field, for example, the first substrate SUB1 can be configured to comprise either of the pixel electrode PE and the common electrode CE and the second substrate SUB2 can be configured to comprise the other of the pixel electrode PE and the common electrode CE. The main surface of the substrate is a surface parallel to an X-Y plane defined by the first direction X and the second direction Y.

The first substrate SUB1 comprises a first insulating substrate 10, signal lines S, common electrodes CE, pixel electrodes PE, a first insulating film 11, a second insulating film 12, a third insulating film 13, a first alignment film AL1, and the like. It should be noted that switching elements, scanning lines, various insulating films interposed between the elements and lines, and the like are not illustrated.

The first insulating substrate 10 is a substrate having a light transmitting property such as a glass substrate or a resin substrate. The first insulating film 11 is located on the first insulating substrate 10. The signal lines S are located on the first insulating film 11. The second insulating film 12 is located on the signal lines S and the first insulating film 11. The common electrodes CE are located on the second insulating film 12. The third insulating film 13 is located on the common electrodes CE and the second insulating film 12. The pixel electrodes PE are located on the third insulating film 13. The pixel electrodes PE are opposed to the common electrodes CE through the third insulating film 13. In addition, the pixel electrodes PE include pixel slits PSL at positions opposed to the common electrodes CE, respectively. The common electrodes CE and the pixel electrodes PE are formed of a transparent, electrically conductive material such as ITO or IZO. The first alignment film AL1 covers the pixel electrodes PE and the third insulating film 13.

The pixel electrodes PE may be located between the second insulating film 12 and the third insulating film 13, and the common electrodes CE may be located between the third insulating film 13 and the first alignment film AL1. In this case, the pixel electrodes PE are formed in a flat plate shape having no slit for each pixel, and the common electrodes CE include pixel slits opposed to the pixel electrodes PE. In addition, both the pixel electrodes PE and the common electrodes CE may be arranged in the first direction X. For example, both the pixel electrodes PE and the common electrodes CE may be formed in a comb shape and arranged to be engaged with each other. In this arrangement, for example, the illustrated third insulating film may be omitted and both the pixel electrodes PE and the common electrodes CE may be located between the second insulating film 12 and the first alignment film AL1, or either of the pixel electrodes PE and the common electrodes CE may be located between the second insulating film 12 and the third insulating film 13 and the other film may be located between the third insulating film 13 and the first alignment film AL1.

The second substrate SUB2 includes a second insulating substrate 20, a light-shielding layer BM, color filters CF1 to CF3, an overcoat layer OC, a second alignment film AL2, and the like.

The second insulating substrate 20 is a substrate having a light transmitting property such as a glass substrate or a resin substrate. The light-shielding layer BM and the color filters CF1 to CF3 are located on a side opposed to the first substrate SUB1 of the second insulating substrate 20. The light-shielding layer BM is disposed at a position which partitions the pixels and which is opposed to the signal lines S in the figure. The color filters CF1 to CF3 are disposed at positions opposed to the pixel electrodes PE and are partially overlaid on the light-shielding layer BM. For example, the color filters CF1 to CF3 are a red color filter (R), a green color filter (G) and a blue color filter (B), respectively. The color filter (R) CF1 is disposed on a red pixel, the color filter (G) CF2 is disposed on a green pixel, and the color filter (B) CF3 is disposed on a blue pixel. The overcoat layer OC covers the color filters CF1 to CF3. The second alignment film AL2 covers the overcoat layer OC.

The color filters CF1 to CF3 may be disposed on the first substrate SUB1. Instead of disposing the light-shielding layer BM, two or more layers of color filters of different colors may be overlaid to reduce the transmittance and function as a light-shielding layer. If the main pixels include a white pixel, a white color filter or an uncolored resin material may be disposed besides the color filters CF1 to CF3, or the overcoat layer OC may be disposed without the color filters.

A first optical element OD1 including a first polarizer PL1 is disposed between the first insulating substrate 10 and a backlight unit BL. A second optical element OD2 including a second polarizer PL2 is located on the second insulating substrate 20. Each of the first optical element OD1 and the second optical element OD2 may include a retardation film as needed. The first polarizer PL1 and the second polarizer PL2 are disposed to be, for example, in a cross-Nicol positional relationship in which axes of the respective polarizers are orthogonal to each other.

In the display panel PNL, each common electrode CE functions as a sensor electrode Se as explained above. In the example illustrated, the common electrode CE is located between the second insulating film 12 and the third insulating film 13, in the first substrate SUB1, and comprises a first conductive layer ML1 and a second conductive layer ML2. The second conductive layer ML2 is located on the second insulating film 12. The first conductive layer ML1 is located on the second conductive layer ML2. In the example illustrated, the first conductive layer ML1 is directly deposited on the second conductive layer ML2. The third insulating film 13 is deposited on the second insulating film 12, in the slit SL of the common electrode CE.

In the example illustrated, the slit SL is formed between the blue pixel PX(B) comprising the color filter (B) CF3 and the red pixel PX(R) comprising the color filter (R) CF1, and is located just above the signal line S between the blue pixel PX(B) and the red pixel PX(R). For example, a width of the slit SL in the first direction X is larger than a width of the signal line S.

Next, a configuration example of the sensor electrode Se will be explained. An area including the sensor electrodes Se22, Se32, and Se42 shown in FIG. 3 will be explained as an example.

Figure 10:
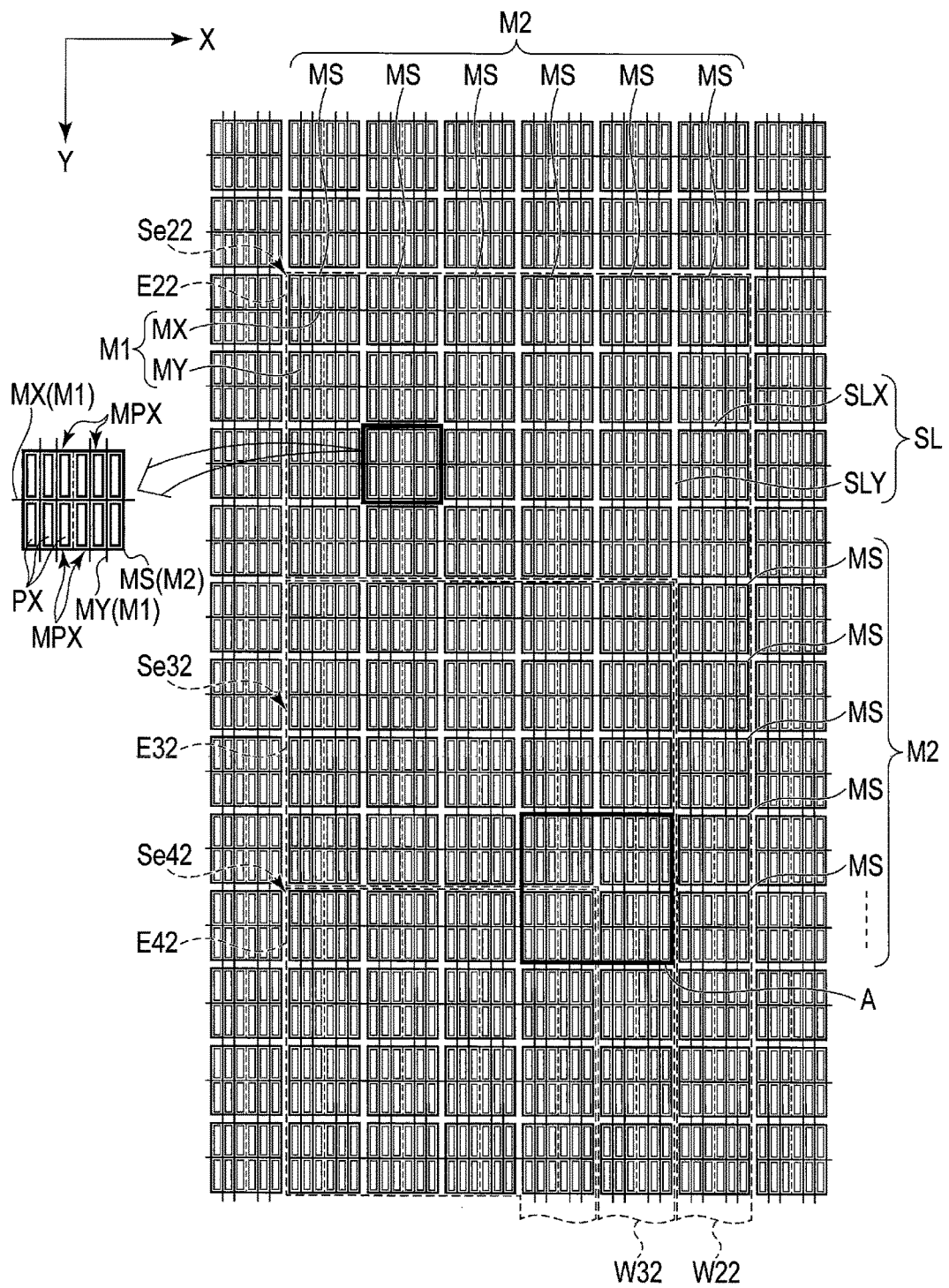
FIG. 10 is a plan view showing a configuration example of the sensor electrodes Se.

FIG. 10 is a plan view showing a configuration example of the sensor electrodes Se. In the figure, rectangles represent sub-conductive layers MS constituting the second conductive layer M2, straight lines extending in the first direction X and the second direction Y represent the first conductive layer M1, and dotted lines represent an outlines of the sensor electrodes Se. The sub-conductive layers MS have, for example, the same shape and the same area. In the example illustrated, each sub-conductive layer MS is disposed on four (=2×2) main pixels MPX including three (=3×1) sub-pixels PX, or twelve (=6×2) sub-pixels PX. As regards the expression n×m, n represents the number of sub-conductive layers arranged in the first direction X and m represents the number of sub-conductive layers arranged in the second direction Y.

The sub-conductive layers MS are arrayed in a matrix in the first direction X and the second direction Y. In other words, the second conductive layer M2 is separated by the lattice-shaped slits SL each including a part SLX extending in the first direction X and a part SLY extending in the second direction Y. The parts SLX are arranged at regular pitches in the second direction Y and the parts SLY are arranged at regular pitches in the first direction X. For example, a pitch of the parts SLX corresponds to a length of two main pixels MPX (or a length of two sub-pixels PX), and a pitch of the parts SLY corresponds to a length of two main pixels MPX (or a length of six sub-pixels PX).

In contrast, the first conductive layer M1 is formed in a lattice shape. In other words, the first conductive layer M1 includes parts MX extending in the first direction X and parts MY extending in the second direction Y. The parts MX are arranged in the second direction Y at regular pitches and, for example, the pitch corresponds to the length of two main pixels MPX (or the length of two sub-pixels PX). The parts MY are arranged in the first direction X and every two parts MY are disposed for one main pixel MPX. The first conductive layer M1 electrically connect adjacent sub-conductive layers MS to each other. In other words, the parts MX connect the sub-conductive layers MS arranged in the first direction X and intersects the parts SLY of the slits SL. In addition, the parts MY connect the sub-conductive layers MS arranged in the second direction Y and intersects the parts SLX of the slits SL.

Attention is focused on the sensor electrode Se22 shown in the figure. The second conductive layer M2 of the electrode portion E22 is separated by the lattice-shaped slits SL and includes twenty-four (=6×4) sub-conductive layers MS. The sub-conductive layers MS are electrically connected to each other by the lattice-shaped first conductive layer M1. Naturally, the first conductive layer M1 and the second conductive layer M2 are cut between the adjacent sensor electrodes.

The second conductive layer M2 of the line portion W22 includes the sub-conductive layers MS aligned in the second direction Y. In other words, the second conductive layer M2 is separated by the ladder-shaped slits SL at the line portion W22. The sub-conductive layers MS are electrically connected to each other by the lattice-shaped first conductive layer M1. In the line portion W22 composed of the sub-conductive layers MS aligned in the second direction Y, the parts MX extending in the first direction X may be omitted to urge the sub-conductive layers MS to be connected to each other by the parts MY extending in the second direction Y, of the first conductive layer M1, but the parts MX desirably exist at the line portion W22, too, to reduce the resistance of the sensor electrode Se22.

At the sensor electrode Se32, the electrode portion E32 comprises twenty (5×4) sub-conductive layers MS, the line portion W32 comprises the sub-conductive layers MS aligned in the second direction Y, and the sub-conductive layers MS are connected by the first conductive layer M1. In addition, at the sensor electrode Se42, the electrode portion E42 comprises sixteen (4×4) sub-conductive layers MS, and the sub-conductive layers MS are connected by the first conductive layer M1.

The number of sub-conductive layers MS of each sensor electrode Se or the area of the electrode portion E and the line portion W are mere examples and can be arbitrarily varied in response to the required touch detection performance. For example, a width of the electrode portion E in the first direction X is equal to a length of forty to one hundred main pixels MPX.

FIG. 11 is an enlarged plan view showing area A including four sub-conductive layers MS shown in FIG. 10. The scanning lines G1 to G7 are arranged in the second direction Y and the signal lines S1 to S15 are arranged in the first direction X. The parts MX extending in the first direction X, of the first conductive layer M1, extend in the scanning lines G and, in the example illustrated, the parts overlap the scanning lines G in planar view. The parts MY extending in the second direction Y, of the first conductive layer M1, extend in the signal lines S and, in the example illustrated, the parts overlap the signal lines S in planar view. In addition, the parts SLX extending in the first direction X, of the slits SL separating the second conductive layer M2, extend in the scanning lines G and, in the example illustrated, the parts overlap the scanning lines G in planar view. The parts SLY extending in the second direction Y, of the slits SL, extend in the signal lines S and, in the example illustrated, the parts overlap the signal lines S in planar view.

The parts MX of the first conductive layer M1 are not disposed at positions overlapping the parts SLX of the slits SL but may be disposed at positions overlapping the parts SLX. Similarly, the parts MY of the first conductive layer M1 are not disposed at positions overlapping the parts SLY of the slits SL but may be disposed at positions overlapping the parts SLY.

The sub-conductive layers MS1 to MS3 are included in the sensor electrode Se32. The sub-conductive layers MS1 and MS2 are arranged in the first direction X and separated by the part SLY8 of the slits SL. The part SLY overlaps the signal line S8. The sub-conductive layers MS1 and MS2 are included in the electrode portion E32 and connected to each other by the part MX3 of the first conductive layer M1. The part MX3 overlaps the scanning line G3.

The sub-conductive layers MS2 and MS3 are arranged in the second direction Y and separated by the part SLX4 of the slits SL. The part SLX4 overlaps the scanning line G4. The sub-conductive layer MS3 is included in the line portion W32. The sub-conductive layers MS2 and MS3 are connected to each other by the parts MY9, MY10, MY12, and MY13 of the first conductive layer M1. The parts MY9, MY10, MY12, and MY13 overlap the signal lines S9, S10, S12 and S13, respectively.

The sub-conductive layer MS4 is included in the electrode portion E42 of the sensor electrode Se42 and is not connected to the sub-conductive layers MS1 to MS3.

The sub-conductive layers MS1 and MS4 are arranged in the second direction Y but the parts MY extending in the second direction Y are separated between the electrode portions E32 and E42. For example, the part MY31 disposed at the electrode portion E32 to overlap the signal line S3 is located in the same straight line as the part MY32 disposed at the electrode portion E32 to overlap the signal line S3, and is remote from the part MY32 between the electrode portions E32 and E42 or at a position which overlaps the scanning line G4.

The sub-conductive layers MS3 and MS4 are arranged in the first direction X but the parts MX extending in the first direction X are separated between the line portion W32 and the electrode portion E42. For example, the part MX51 disposed at the electrode portion E42 to overlap the scanning line G5 is located in the same straight line as the part MX52 disposed at the line portion W32 to overlap the scanning line G5, and is remote from the part MX52 between the line portion W32 and the electrode portion E42 or at a position which overlaps the signal line G8.

When attention is focused on the parts MX extending in the first direction X, of the first conductive layer M1, the parts are disposed to overlap every other scanning lines G. In the example shown in FIG. 5, the parts MX are disposed at positions which overlap the odd-numbered scanning lines G1, G3, G5, G7, . . . but are not disposed at positions which overlap the even-numbered scanning lines G2, G4, G6, . . . .

When attention is focused on the parts MY extending in the second direction Y, of the second conductive layer M2, the parts are disposed not to overlap every two signal lines S. In the example illustrated, the parts MY are not disposed at positions which overlap the signal lines S2, S5, S8, S11, S14, . . . but are disposed at positions which overlap the other signal lines. When attention is focused on the region where the sub-conductive layer MS2 is disposed, for example, each of the parts MY9 and MY12 is located between the red pixel PX(R) and the green pixel PX(G), each of the parts MY10 and MY13 is located between the green pixel PX(G) and the blue pixel PX(B), and no parts MY exist between the red pixel PX(R) and the blue pixel PX(B).

The part SLY of the slit SL is located between the red pixel PX(R) and the blue pixel PX(B).

According to the present embodiments, the sensor electrodes Se are disposed at positions which do not overlap each other in planar view, the electrode portions E of the respective sensor electrodes Se are disposed in a matrix in the first direction X and the second direction Y, and the touch detection can be executed in the self-capacitive mode. In addition, the touch detection at two or more points can also be executed and the detection performance can be improved.

The electrodes necessary for the touch detection are the sensor electrodes Se located on the same plane, and the other electrodes opposed to the sensor electrodes Se in the third direction Z are unnecessary. The other electrodes adjacent to the sensor electrodes Se do not need to be disposed, in the same plane, either. For this reason, the process of manufacturing the sensor SS can be simplified. In the configuration example of the present embodiments, a specific manufacturing process does not need to be added to form the sensor electrodes Se since the sensor electrodes Se can be used to serve as the common electrodes CE necessary for the display device DSP.

Each of the sensor electrodes Se comprises the first conductive layer M1 formed of a first member and the second conductive layer M2 formed of a second member different from the first member. When the sensor electrodes Se and the common electrodes CE are used to serve as each other, the second conductive layer M2 is disposed in a wider range as compared with the first conductive layer M1 when the second conductive layer M2 is disposed in the region in which the layer is necessary as the common electrodes CE. In this case, too, the resistance of the sensor electrodes Se or the common electrodes CE can be lowered since the first conductive layer M1 is formed of the member of a lower resistivity than the second conductive layer M2. Even when the second conductive layer M2 is composed of insular sub-conductive layers MS separated from each other, the first conductive layer M1 electrically connects the adjacent sub-conductive layers MS to each other. For this reason, the performance required for the sensor electrodes Se and the performance required for the common electrodes CE can be implemented irrespective of the shape of the second conductive layer M2.

The sub-conductive layers MS constituting the second conductive layer M2 are separated by the slits SL of the second conductive layer M2. In the configuration example shown in FIG. 10, the slits SL are lattice-shaped comprising the parts SLX extending in the first direction X and the parts SLY extending in the second direction Y, the parts SLX are arranged at regular pitches in the second direction Y, and the parts SLY are arranged at regular pitches in the first direction X. For this reason, the outline of the slits SL or the sensor electrodes Se can hardly be recognized visually in the display device DSP comprising the sensor electrodes Se, and deterioration in display quality of the images displayed on the display device DSP can be suppressed.

In addition, the parts SLY which overlap the signal lines S, of the slits SL, are located between the red pixels and the blue pixels. For this reason, even if an undesired leak field is formed between the signal lines S and the pixel electrodes PE via the parts SLY, the influence to the displayed images can be reduced. In other words, since red color and blue color have lower luminous efficacy than green color, deterioration in the display quality such as non-uniformity in display and color mixing can be suppressed since the undesired leak field urges the liquid crystal layer LC of the red pixels and the blue pixels to make an operation error. The pitch of the parts SLY desirably has a length of two or three main pixels MPX in consideration of visibility of the slits, influence of the leak field, and the like.

In addition, the line portions W are formed to have a smaller width than the electrode portions E, in the respective sensor electrodes Se. For this reason, operation of the line portion W as the electrode for touch detection can be suppressed, and detection errors can also be suppressed. Reduction in the areas of the electrode portions E of the sensor electrodes Se located in vicinity to the sensor controller 100 can be suppressed in the sensor electrode group SeG. In the configuration example shown in FIG. 10, the width of the line portion W in the first direction X is equal to the width of one sub-conductive layer MS and corresponds to the length of two main pixels MPX. The width of the line portion W is desirably the length of one to three main pixels MPX in consideration of influence of the detection errors, and the like.

Next, another configuration example will be explained.

FIG. 12 is a cross-sectional view showing another configuration example of the display panel PNL shown in FIG. 1. The configuration example shown in FIG. 12 is different from the configuration example shown in FIG. 9 with respect to a feature that the second conductive layer ML2 constituting the common electrodes CE (sensor electrodes Se) is deposited on the first conductive layer ML1. In other words, the first conductive layer ML1 is located on the second insulating film 12. The first conductive layer ML1 is located just above the signal lines S. The second conductive layer ML2 is directly deposited on the first conductive layer ML1 and is also located on the second insulating film 12.

In this configuration example, too, the same advantages as those of the above-described configuration example can be obtained.

FIG. 13 is a plan view showing another configuration example of the sensor electrodes Se. The configuration example shown in FIG. 13 is different from the configuration example shown in FIG. 10 with respect to a feature that the second conductive layer M2 constituting the sensor electrodes Se is sequentially formed across the electrode portions E and the line portions W. The second conductive layer M2 is formed in an insular shape for each sensor electrode Se, and integrally formed without being cur at the electrode portions E and the line portions W. In other words, the second conductive layer M2 is separated by the slits SL along the outlines of the sensor electrodes Se. The parts SLX extending in the first direction X of the slits SL separate the sensor electrodes Se adjacent in the second direction Y. The parts SLY extending in the second direction Y of the slits SL separate the sensor electrodes Se adjacent in the first direction X. Similarly to the configuration example shown in FIG. 11, the parts SLX overlap the scanning lines, the parts SLY overlap the signal lines, and the first conductive layer M1 is formed in a lattice shape comprising the parts MX and the parts MY.

For example, the sensor electrode Se32 shown in the figure comprises a rectangular electrode portion E32 and the line portion W32 extending in the second direction Y. The sensor electrode Se32 and the second conductive layer M2 are surrounded by the parts SLX1 and SLX2, and the parts SLY1 to SLY3 of the slits SL. The part SLX1 is located between the electrode portions E22 and E32. The part SLX2 is located between the electrode portions E32 and E42. The part SLY2 is located between the electrode portion E42 and the line portion W32. The part SLY3 is located between the line portion W22, and the electrode portion E32 and the line portion W32. The first conductive layer M1 is formed in a lattice shape but may include at least the parts MY parallel to the direction of extension of the line portion W32. In addition, the first conductive layer M1 is cut at positions overlaid on the slits SL.

In the electrode portion E of each of the sensor electrodes Se, the second conductive layer M2 includes dummy slits DSL which are scattered inside. In the example illustrated, the dummy slits DSL extend in the second direction Y. The parts MX of the first conductive layer M1 intersect between the dummy slits DSL arranged in the second direction Y. The parts MY of the first conductive layer M1 are arranged parallel to the dummy slits DSL, between the dummy slits DSL arranged in the first direction X. The dummy slits DSL are formed at the same portions as the parts SLY of the slits SL shown in FIG. 11, overlap the signal lines S, and are located between the red pixels PX(R) and the blue pixels PX(B). The dummy slits DSL are arranged at regular pitches in the first direction X. The dummy slits DSL are partially located on the same straight line as the slits SLY2 and SLY3 in the figure. A pitch of the dummy slits DSL is equal to a slit of the slits SLY2 and SLY3. For example, the pitch of the dummy slits DSL corresponds to the length of two main pixels MPX (or the length of six sub-pixels PX).

The dummy slits DSL may include portions extending in the first direction X. The portions extending in the first direction X are formed at the same positions as, for example, the parts SLX of the slits SL shown in FIG. 11 and overlap the scanning lines G.

In this configuration example, the dummy slits DSL are formed at regular pitches in the configuration in which the electrode portions E and the line portions W of the sensor electrodes Se are integrally formed by the second conductive layer M2. For this reason, the outlines of the slits SL or the sensor electrodes Se can hardly be recognized visually, and the same advantages as those of the above-explained configuration examples can be obtained. In addition, even if the resistance of the second conductive layer M2 is made higher by forming the dummy slits DSL in the second conductive layer M2, the performance required for the sensor electrodes Se can be implemented since the lattice-shaped first conductive layer M1 is disposed on the second conductive layer M2.

Figure 14:
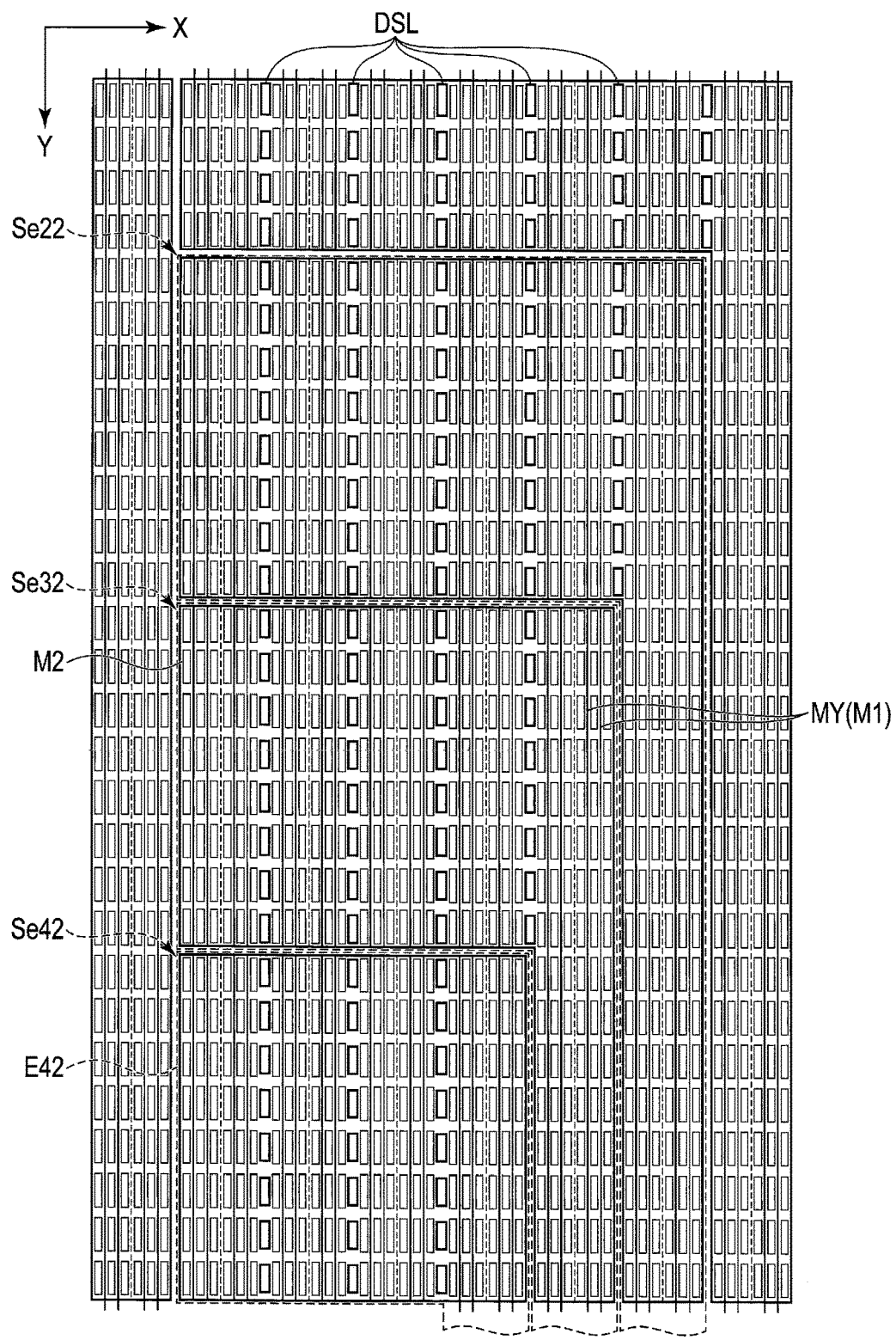
FIG. 14 is a plan view showing another configuration example of the sensor electrodes Se.

FIG. 14 is a plan view showing another configuration example of the sensor electrodes Se. The configuration example shown in FIG. 14 is different from the configuration example shown in FIG. 13 with respect to a feature that the first conductive layer M1 constituting the sensor electrodes Se is formed in a stripe shape. In other words, the first conductive layer M1 includes the parts MY alone and does not include the parts MX shown in FIG. 13 and the like.

In this configuration example, too, the same advantages as those of the above-described configuration example can be obtained.

FIG. 15 is an illustration showing another configuration example of the sensor SS of the present embodiments. The configuration example shown in FIG. 15 is different from the configuration example in FIG. 3 with respect to a feature that the positions where the line portions W and the electrode portions E are coupled are alternately inverted in the sensor electrodes Se arranged in the second direction Y. In other words, in the configuration example shown in FIG. 3, all the line portions W of the sensor electrodes Se are connected to the corner portions located on the same side of the electrode portions E (lower right corner portions of the electrode portions E in the example illustrated). In contrast, when attention is focused on the sensor electrodes Se12, Se22, Se32 and Se42 arranged in the second direction Y, for example, in the configuration example shown in FIG. 15, the line portion W12 is connected to a lower right corner portion of the electrode portion E12, the line portion W22 is connected to a lower left corner portion of the electrode portion E22, the line portion W32 is connected to a lower right corner portion of the electrode portion E32, and the line portion W42 is connected to a lower left corner portion of the electrode portion E42. When attention is focused on the sensor electrodes Se11 to Se14 arranged in the first direction X, each line portion W is connected to the lower right corner portion of the electrode portion.

In this configuration example, too, the same advantages as those of the above-described configuration example can be obtained.

Figure 16:
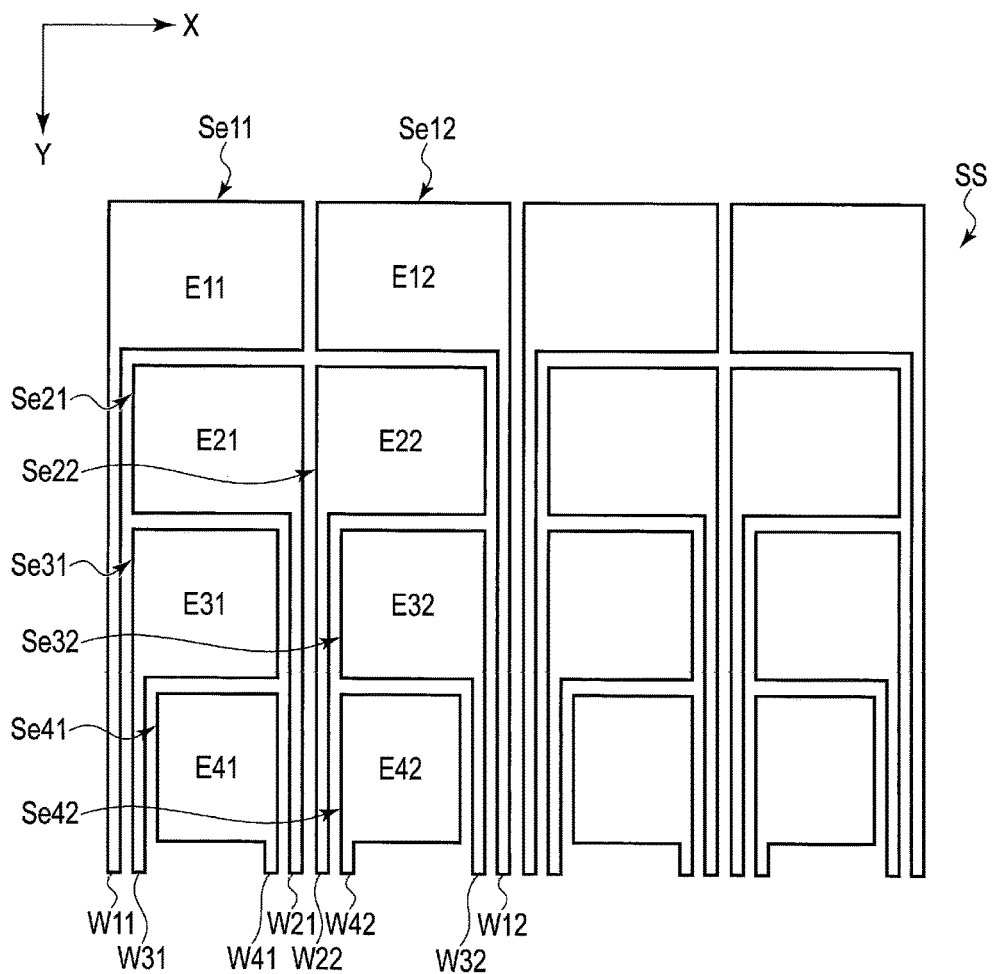
FIG. 16 is an illustration showing another configuration example of the sensor SS of the present embodiments.

FIG. 16 is an illustration showing another configuration example of the sensor SS of the present embodiments. The configuration example shown in FIG. 16 is different from the configuration example in FIG. 15 with respect to a feature that the positions where the line portions W and the electrode portions E are coupled are alternately inverted in the sensor electrodes Se arranged in the first direction X and the second direction Y. In the example illustrated, the sensor electrodes Se11, Se21, Se31 and Se41 arranged in the second direction Y have a relationship of mirror image (or have line symmetry with respect to an axis passing between the sensor electrodes Se11 and Se12) with the sensor electrodes Se12, Se22, Se32 and Se42 arranged in the second direction Y.

More specifically, the line portion W11 is connected to a lower left corner portion of the electrode portion E11, the line portion W21 is connected to a lower right corner portion of the electrode portion E21, the line portion W31 is connected to a lower left corner portion of the electrode portion E31, and the line portion W41 is connected to a lower right corner portion of the electrode portion E41. The line portion W12 is connected to a lower right corner portion of the electrode portion E12, the line portion W22 is connected to a lower left corner portion of the electrode portion E22, the line portion W32 is connected to a lower right corner portion of the electrode portion E32, and the line portion W42 is connected to a lower left corner portion of the electrode portion E42.

In this configuration example, too, the same advantages as those of the above-described configuration example can be obtained.

FIG. 17 is an illustration showing another configuration example of the sensor SS of the present embodiments. The configuration example shown in FIG. 17 is different from each of the above-explained configuration examples with respect to shapes of the sensor electrodes Se. In the example illustrated, a sensor electrode Se51 is formed to be substantially shaped in letter U in which line portions W511 and W512 are connected to two corner portions of an electrode portion E51, respectively. A sensor electrode Se52 is located between the line portions W511 and W512 and formed to be substantially shaped in letter U in which line portions W511 and W512 are connected to two corner portions of an electrode portion E52, respectively. A sensor electrode Se53 is located between the line portions W521 and W522 and formed to be substantially shaped in letter T in which a line portion W53 is connected to a central portion of an electrode portion E53. An electrode portion W54 of the sensor electrode Se54 is located between the line portions W521 and W53, and an electrode portion E55 of a sensor electrode Se55 is located between the line portions W522 and W53.

In this configuration example, too, the same advantages as those of the above-described configuration example can be obtained.

Figure 18:
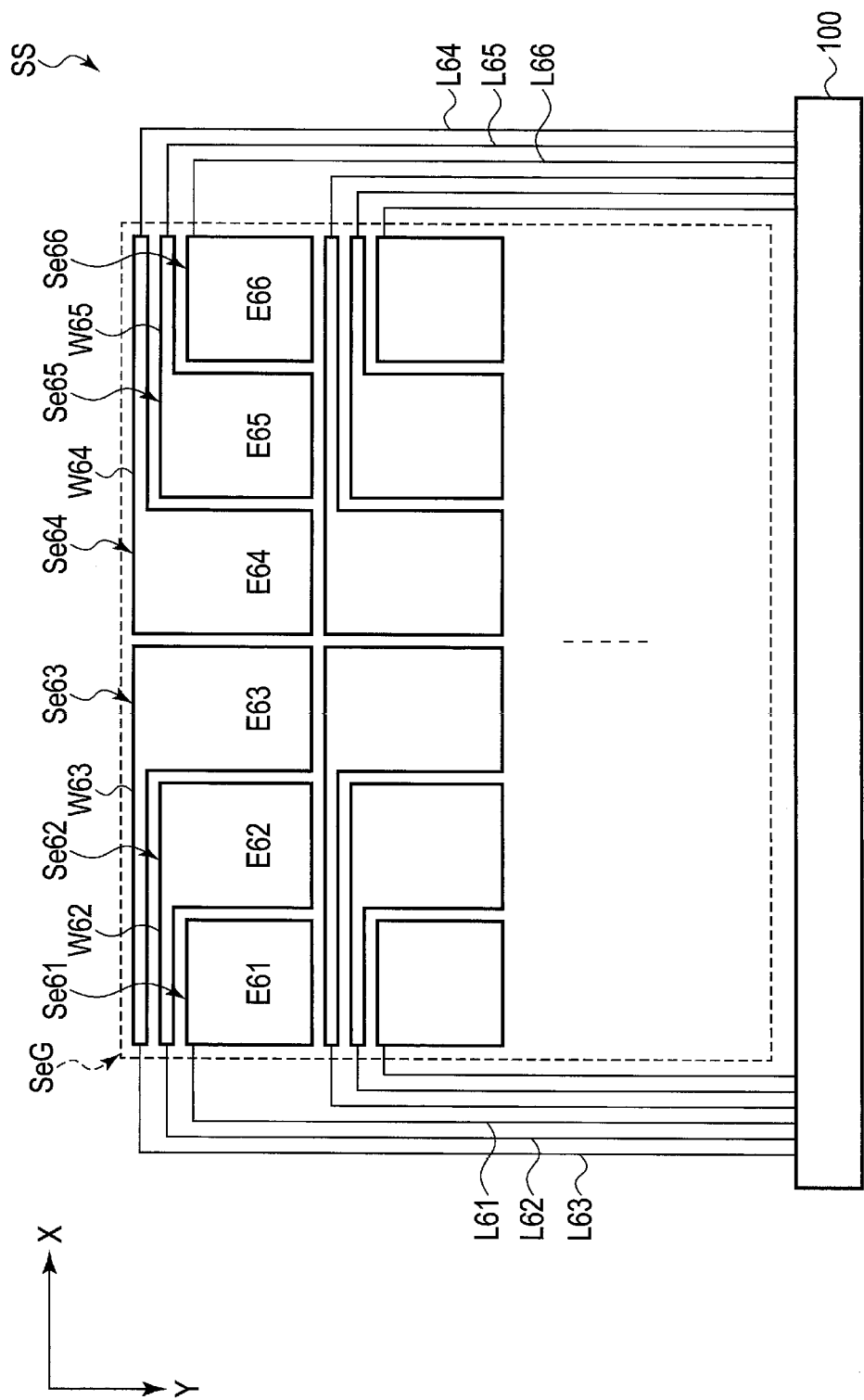
FIG. 18 is an illustration showing another configuration example of the sensor SS of the present embodiments.

FIG. 18 is an illustration showing another configuration example of the sensor SS of the present embodiments. The configuration example shown in FIG. 18 is different from each of the above-explained configuration examples with respect to a feature that each of the sensor electrodes Se comprises a line portion extending in the first direction X. Sensors Se61 to 66 are arranged in the first direction X. In the example illustrated, sensor electrodes Se63, Se62 and Se61 have a relationship of mirror image (or have line symmetry with respect to an axis passing between the sensor electrodes Se63 and Se64) with sensor electrodes Se64, Se65 and Se66. The sensors Se61 to 66 have different areas. A sensor electrode Se61 comprises an electrode portion E61 and a line portion W61. The line portion W61 is connected to an upper left corner portion of the electrode portion E61 and extends in the first direction X. The sensor electrode Se62 comprises an electrode portion E62 arranged with the electrode portion E61 in the first direction X and a line portion W62 extending in the first direction X. The electrode portion E62 and the line portion W62 are arranged with the line portion W61 in the second direction Y. The line portion W62 is connected to an upper left corner portion of the electrode portion E62. An electrode portion E63 of a sensor electrode Se63 is arranged with the electrode portion E62 in the first direction X and arranged with the line portion W62 in the second direction Y. Lead lines L61 to L66 connected to the sensor electrodes Se61 to Se66, respectively, are drawn to the outside of the region where the sensor electrode group SeG is disposed, extend in the second direction Y, and are connected to the sensor controller 100.

As regards the sensor electrodes Se in the present configuration example, the positions where the line portions and the electrode portions are coupled may be alternately inverted in the sensor electrodes Se arranged in the first direction X, similarly to the configuration example shown in FIG. 15, the positions where the line portions and the electrode portions are coupled may be alternately inverted in the sensor electrodes Se arranged in the first direction X and the second direction Y, similarly to the configuration example shown in FIG. 16, or the sensor electrodes Se may be formed in the same shape as that in the configuration example shown in FIG. 17.

Figure 19:
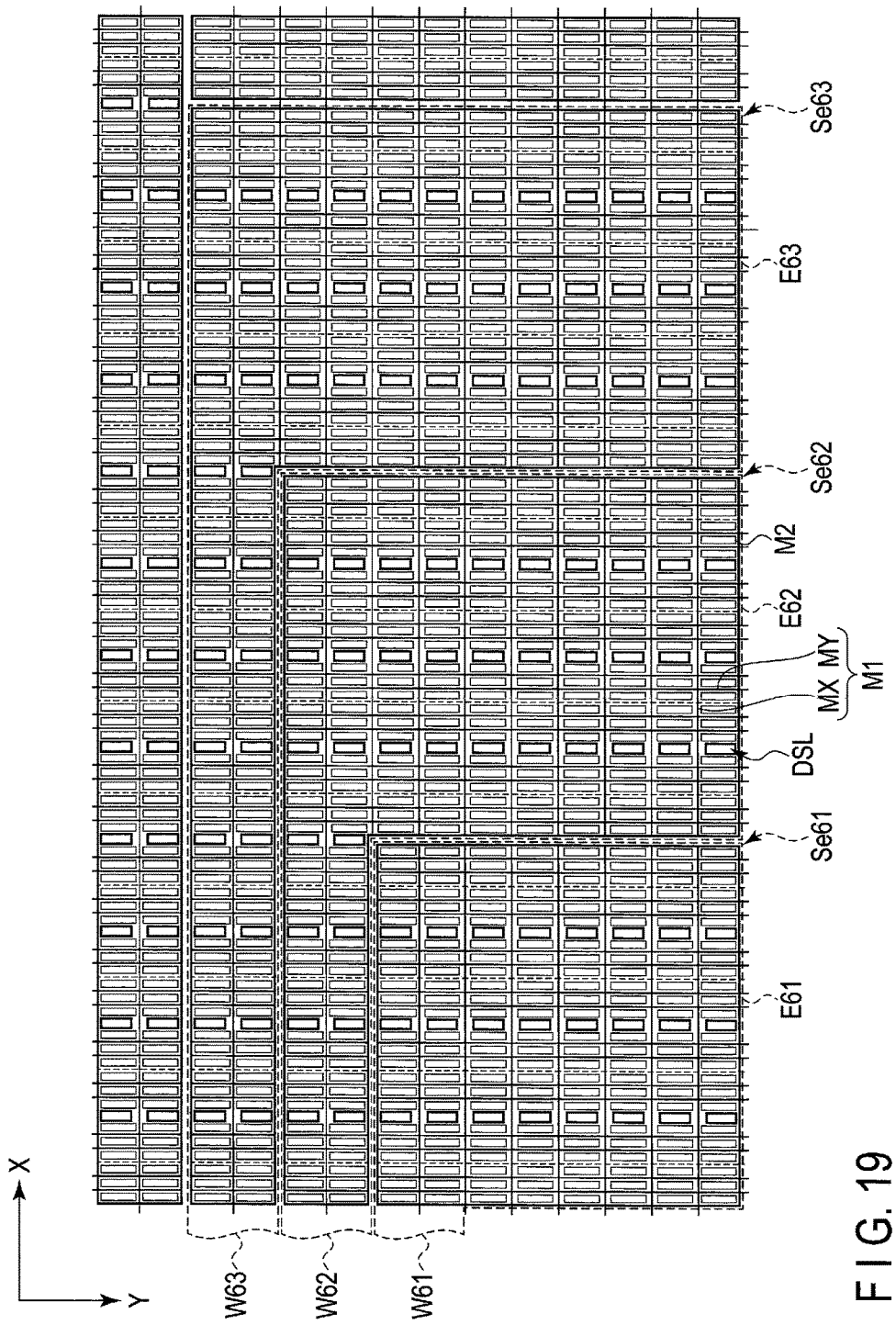
FIG. 19 is a plan view showing a configuration example of sensor electrodes Se61 to Se63 shown in FIG. 18.

FIG. 19 is a plan view showing a configuration example of sensor electrodes Se61 to Se63 shown in FIG. 18. Similarly to the configuration example shown in FIG. 13, the second conductive layer M2 constituting the sensor electrodes Se is sequentially formed across the electrode portions E and the line portions W. The first conductive layer M1 is deposited on the second conductive layer M2 and is formed in a lattice shape including the parts MX and the parts MY. The first conductive layer M1 may include at least the parts MX parallel to the direction of extension of the line portions W and the parts MY may not be formed. At the electrode portions E, however, the first conductive layer M1 is desirably formed in a lattice shape from the viewpoint of the reduction in resistance. In the electrode portions E and the line portions W of each of the sensor electrodes Se, the second conductive layer M2 includes dummy slits DSL which are scattered inside. The dummy slits DSL extend in the second direction Y but may also include portions extending in the first direction X.

The sensor electrodes Se may comprise a second conductive layer M2 formed of sub-conductive layers MS and a lattice-shaped first conductive layer M1 which connect the sub-conductive layers MS, similarly to the configuration example shown in FIG. 10.

In this configuration example, too, the same advantages as those of the above-described configuration example can be obtained. In addition, if the sensor electrode group SeG is disposed in a longitudinally elongated region in which the length in the second direction Y is greater than the length in the first direction X, the number of the sensor electrodes Se arranged in the first direction X is smaller than that in a case where the sensor electrode group SeG is disposed in a laterally elongated region. In this case, the region for disposing the line portions W does not need to be secured between the electrode portions E adjacent in the first direction X, the area of the electrode portions E can be secured to be larger, and a difference in area for disposing the sensor electrodes Se can be made smaller, by using the line portions W extending in the first direction X. Connection between the sensor controller 100 and the sensor electrodes Se is made by the lead lines L drawn to the surrounding of the sensor electrode group SeG. Since the lead lines L can be formed of a metal material having a comparatively low resistance, similarly to the first conductive layer M1, the lead lines L can suppress increase in the line resistance caused by extension of the line length.

Next, another configuration example will be explained. A configuration example of using the signal lines S as auxiliary lies of the sensor electrodes Se will be explained.

FIG. 20 is an illustration showing another configuration example of the sensor SS of the present embodiments. Sensor electrodes Se71 to Se75 are arranged in the second direction Y and connected to lead lines L71 to L75, respectively. The lead lines L73 to L75 are located on one of end sides (i.e., a side on which the sensor controller 100, the signal line driver SD, and the like are disposed) of the sensor electrodes, and the line portions W73 and W74 extend to the one-end side in the second direction Y. The lead lines L71 and L72 are located on the other end side (i.e., a side opposite to the sensor controller 100, the signal line driver SD, and the like) of the sensor electrodes, and the line portion W72 extends to the other side in the second direction Y.

The signal lines S1 to S7 extend from the one-end side to the other end side in the second direction Y. The select circuit MP is located on the one-end side and has a function of selectively switching the connection between the signal lines and the signal line driver SD or the sensor controller 100. In addition, an auxiliary select circuit SMP is located on the other side of the signal lines S1 to S7 and has a function of selectively switching the connection between the signal lines S1 to S7 and the lead lines L71 and L72.

A select switch SSW1 is connected to the signal line driver SD in, for example, a display period of displaying the images. A select switch SSW11 becomes conductive to sequentially connect the signal line driver SD and the signal line S1. At this time, other select switches SSW12 and SSW13 are nonconductive. The select switches SSW12 and SSW13 sequentially become conductive, subsequently with the select switch SSW11, and the signal lines S2 and S3 are connected to the signal line driver SD at timing at which the select switches become conductive. At this time, each of select switches SSW21 to SSW23 in the auxiliary select circuit SMP is nonconductive.

The select switch SSW1 is connected to the sensor controller 100 in a detection period for executing the touch detection. Then, the select switches SSW11 to SSW13 simultaneously become conductive. In addition, the select switches SSW21 to SSW23 in the auxiliary select circuit SMP also become conductive simultaneously, and the signal lines S1 to S3 are connected to a lead line L71. The sensor electrode Se71 is electrically connected to the sensor controller 100 via the signal lines S1 to S3 and the lead line L71. The sensor controller 100 can drive the sensor electrodes Se71 by a sensor signal and obtain a detection signal. Similarly to this, a sensor electrode Se72 is electrically connected to the sensor controller 100 via the signal lines S4 to S7 and the lead line L72. The sensor electrodes Se73 to Se75 are electrically connected to the sensor controller 100 via the lead lines L73 to L75, respectively.

In this configuration example, too, the same advantages as those of the above-described configuration example can be obtained. In addition, the sensor electrodes Se located on the other end side remote from the sensor controller 100 can be connected to the sensor controller 100 via the signal lines S which function as the auxiliary lines and, the area of the electrode portions E in the sensor electrodes Se can be secured to be larger and a difference in area for disposing the sensor electrodes Se can be made smaller as compared with the configuration example shown in FIG. 3 in which all the line portions W of the sensor electrodes Se are drawn to the sensor controller 100. Since the signal lines S can be used as auxiliary lines, other lines do not need to be disposed. Since the signal lines S are formed of a metal material having a comparatively low resistance, the signal lines S can suppress increase in the line resistance.

FIG. 21 is an illustration showing another configuration example of the sensor SS of the present embodiments. The configuration example shown in FIG. 21 is different from the configuration example in FIG. 20 with respect to a feature that the scanning lines G are used as auxiliary lines for the sensor electrodes Se. Sensor electrodes Se81 to Se85 are arranged in the first direction X and connected to lead lines L81 to L85, respectively. The lead lines L81 to L83 are located on one of end sides (i.e., the left side in the figure or a side on which the scanning line driver GD and the like are disposed) of the sensor electrodes, and line portions W82 and W83 extend to the one-end side in the first direction X. The lead lines L84 and L85 are located on the other end side (i.e., a side opposite to the scanning line driver GD and the like) of the sensor electrodes, and a line portion W84 extends to the other side in the first direction X.

The scanning lines G1 to G7 extend from the one-end side to the other end side in the first direction X. A select circuit MPG for the scanning lines is located on the one-end side and has a function of selectively switching the connection between the scanning lines G1 and G5 and the scanning line driver GD or the sensor controller 100. In addition, the auxiliary select circuit SMPG for the scanning lines is located on the other end side and has a function of selectively switching the connection between the scanning lines G1 and G5 and the lead lines L84 and L85.

A select switch SSW31 of the select circuit MPG is connected to the scanning line driver GD in, for example, a display period of displaying the images. The scanning line G1 is connected to the scanning line driver GD. At this time, a select switch SSW32 of the auxiliary select circuit SMPG is nonconductive. The other scanning lines G2 to G7 are connected to the scanning line driver GD without intervention of the select switches, but may be connected to the scanning line driver GD via the select switches, similarly to the scanning line G1.

The select switch SSW31 is connected to the sensor controller 100 in a detection period for executing the touch detection. The select switch SSW32 also becomes conductive and the scanning line G1 is connected to the lead line L84. The sensor electrode Se84 is thereby electrically connected to the sensor controller 100 via the scanning line G1 and the lead line L84. The sensor controller 100 can drive the sensor electrodes Se84 by a sensor signal and obtain a detection signal. Similarly to this, the sensor electrode Se85 is electrically connected to the sensor controller 100 via the scanning line G5 and the lead line L85. The sensor electrodes Se81 to Se83 are electrically connected to the sensor controller 100 via the lead lines L81 to L83, respectively.

In this configuration example, too, the same advantages as those of the configuration example shown in FIG. 20 can be obtained.

FIG. 22 is an illustration showing another configuration example of the sensor SS of the present embodiments. The configuration example shown in FIG. 22 is different from each of the above-explained configuration examples with respect to a feature of comprising a select circuit MPS for sensor between the sensor electrodes Se and the sensor controller 100. The select circuit MPS comprises, for example, select switches SSW91 to SSW94 in response to sensor electrodes Se91 to Se94.

In the detection period, the select switch SSW91 becomes conductive to connect the sensor electrode Se91 and the sensor controller 100. At this time, other select switches SSW92 and SSW94 are nonconductive. The sensor controller 100 can drive the sensor electrodes Se91 by a sensor signal and obtain a detection signal. After that, the select switch SSW91 becomes nonconductive while the select switch SSW92 becomes conductive, and the sensor controller 100 can drive the sensor electrode Se92. Similarly to this, the sensor controller 100 can also drive the sensor electrodes Se93 and Se94 sequentially.

In this configuration example, too, the same advantages as those of the above-described configuration example can be obtained. In addition, the sensor controller 100 can drive the sensor electrode Se over one channel and the number of channels of the sensor controller 100 can be reduced.

Figure 23:
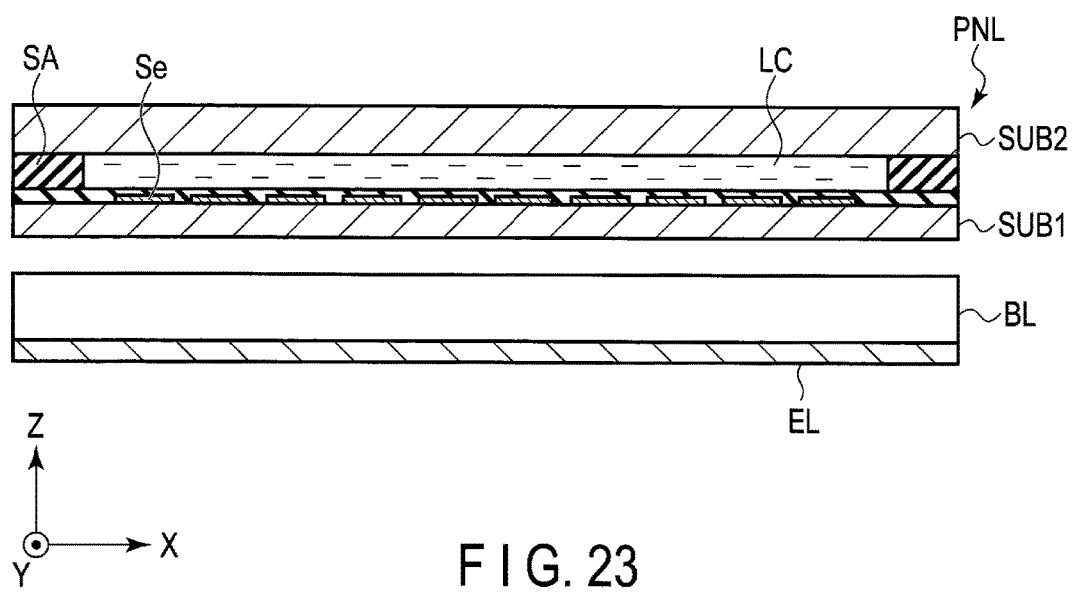
FIG. 23 is an illustration showing another configuration example of the sensor SS of the present embodiments.

FIG. 23 is an illustration showing another configuration example of the sensor SS of the present embodiments. The configuration example shown in FIG. 23 is different from each of the above-explained configuration examples with respect to a feature that an electrode layer EL of a referential potential (for example, a ground potential) at a position opposed to the sensor electrodes Se in a third direction Z. The electrode layer EL is disposed on a back surface of the backlight unit BL in the example illustrated, but may be disposed on a cover member located on the display surface side of the display device DSP or the like and a metal frame of the backlight unit BL or a metal frame which accommodates the backlight unit BL and the display device DSP may be used as the conductive layer EL. The sensor controller 100 can detect existence of the pressure of pushing the display panel PNL, magnitude of the pressure, position information of the pressed region and the like, by detecting a signal based on the capacitance variation which results from the variation of the gap between the electrode layer EL and the sensor electrodes Se in the third direction Z.

The display panel may include an air layer, a cushion layer or the like as a layer which allows the gap between the electrode layer EL and the sensor electrodes Se in the third direction Z to be changed.

According to the embodiments, as described above, the sensor and the sensor-equipped display device capable of enhancing the detection performance can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In the present embodiments, the display device DSP is a liquid crystal display device but is not limited to this. If the display device DSP is an organic EL display device comprising the organic EL element, the EL element comprises the pixel electrode PE, the common electrode CE opposed to the pixel electrode PE, and an emitting layer located between the pixel electrode PE and the common electrode CE, and is disposed on the first substrate SUB1. In this organic EL display device, the emitting layer functions as a display function layer and the common electrodes CE function as the sensor electrodes Se.

What is claimed is:
1. A sensor-equipped display device, comprising:
an insulating substrate;
pixel electrodes above the insulating substrate;
a first sensor electrode comprising a first electrode portion and a first line portion connected to the first electrode portion; and
a second sensor electrode comprising a second electrode portion and a second line portion connected to the second electrode portion,
each of the first sensor electrode and the second sensor electrode being opposed to the pixel electrodes,
the first sensor electrode being disposed at a position which does not overlap the second sensor electrode in planar view,
each of the first sensor electrode and the second sensor electrode comprising a first conductive layer formed of a first member and a second conductive layer which is formed of a second member different from the first member and which is disposed on the first conductive layer,
wherein the second conductive layer includes sub-conductive layers and each of the sub-conductive layers is electrically connected by the first conductive layer, at the first line portion and the second line portion.
2. The sensor-equipped display device of claim 1, further comprising:
a sensor controller connected to each of the first line portion and the second line portion,
wherein
the sensor controller supplies a sensor signal to each of the first sensor electrode and the second sensor electrode, and reads a detection signal indicating capacitance variation generated at each of the first sensor electrode and the second sensor electrode supplied with the sensor signals.

3. The sensor-equipped display device of claim 1, wherein the first member is a metal material and the second member is a transparent conductive material.

4. The sensor-equipped display device of claim 1, wherein the first electrode portion and the second electrode portion are arranged in a first direction,
the first line portion and the second line portion are arranged in the first direction, and
the first line portion and the second line portion extend in a second direction intersecting the first direction.

5. The sensor-equipped display device of claim 1, wherein the first conductive layer extends in at least one of a first direction and a second direction intersecting each other, at the first line portion and the second line portion.

6. The sensor-equipped display device of claim 1, further comprising:
a scanning line above the insulating substrate; and
a signal line above the insulating substrate, wherein
the first conductive layer extends along at least one of the scanning line and the signal line.

7. The sensor-equipped display device of claim 1, further comprising:
pixels including a red pixel, a green pixel and a blue pixel above the insulating substrate, wherein
the first conductive layer is located in at least one of an interval between the red pixel and the green pixel and an interval between the green pixel and the blue pixel.

8. The sensor-equipped display device of claim 1, wherein a width of the second conductive layer is greater than a width of the first conductive layer.

9. The sensor-equipped display device of claim 1, wherein the second conductive layer extends parallel to the first conductive layer, at the first line portion and the second line portion.

10. The sensor-equipped display device of claim 1, wherein
the sub-conductive layers are arranged in an extension direction of the first conductive layer, at the first line portion and the second line portion.

11. A sensor-equipped display device, comprising:
an insulating substrate;
pixel electrodes above the insulating substrate;
a first sensor electrode comprising a first electrode portion and a first line portion connected to the first electrode portion; and
a second sensor electrode comprising a second electrode portion and a second line portion connected to the second electrode portion,
each of the first sensor electrode and the second sensor electrode being opposed to the pixel electrodes,
the first sensor electrode being disposed at a position which does not overlap the second sensor electrode in planar view,
each of the first sensor electrode and the second sensor electrode comprising a first conductive layer formed of a first member and a second conductive layer which is formed of a second member different from the first member and which is disposed on the first conductive layer,
wherein the first conductive layer at each of the first electrode portion and the second electrode portion is located on a same straight line and is separated between the first electrode portion and the second electrode portion.

12. A sensor-equipped display device, comprising:
an insulating substrate;
pixel electrodes above the insulating substrate;
a first sensor electrode comprising a first electrode portion and a first line portion connected to the first electrode portion; and
a second sensor electrode comprising a second electrode portion and a second line portion connected to the second electrode portion,
each of the first sensor electrode and the second sensor electrode being opposed to the pixel electrodes,
the first sensor electrode being disposed at a position which does not overlap the second sensor electrode in planar view,
each of the first sensor electrode and the second sensor electrode comprising a first conductive layer formed of a first member and a second conductive layer which is formed of a second member different from the first member and which is disposed on the first conductive layer,
wherein the second conductive layer includes dummy slits which are scattered inside the second conductive layer and the dummy slits extend in at least one of a first direction and a second direction intersecting each other, at each of the first electrode portion and the second electrode portion.

13. The sensor-equipped display device of claim 12, further comprising:
a scanning line above the insulating substrate; and
a signal line above the insulating substrate, wherein
the dummy slits extend along at least one of the scanning line and the signal line.

14. The sensor-equipped display device of claim 12, wherein
the dummy slits of the second conductive layer are located in an interval between a red pixel and a blue pixel.

15. A sensor-equipped display device, comprising:
an insulating substrate;
pixel electrodes above the insulating substrate;
a first sensor electrode comprising a first electrode portion and a first line portion connected to the first electrode portion; and
a second sensor electrode comprising a second electrode portion and a second line portion connected to the second electrode portion,
each of the first sensor electrode and the second sensor electrode being opposed to the pixel electrodes,
the first sensor electrode being disposed at a position which does not overlap the second sensor electrode in planar view,
each of the first sensor electrode and the second sensor electrode comprising a first conductive layer formed of a first member and a second conductive layer which is formed of a second member different from the first member and which is disposed on the first conductive layer,
wherein the first line portion is drawn to a first end side, and
the second line portion is drawn to a second end side opposite to the first end side and is electrically connected to an auxiliary line extending from the first end side to the second end side.

16. A sensor-equipped display device, comprising:
an insulating substrate;
a scanning line above the insulating substrate;
a signal line above the insulating substrate;
pixel electrodes above the insulating substrate; and
sensor electrodes opposed to the pixel electrodes, each of the sensor electrodes comprising an electrode portion and a line portion connected to the electrode portion, each of the sensor electrodes comprising a first conductive layer formed of a first member and a second conductive layer which is formed of a second member different from the first member and which is disposed on the first conductive layer, wherein the second conductive layer includes a slit extending along at least one of the scanning line and the signal line.

17. The sensor-equipped display device of claim 16, wherein the slit of the second conductive layer is located in an interval between a red pixel and a blue pixel.

* * * * *